(12) United States Patent
Bogaerts

(10) Patent No.: US 8,040,269 B2
(45) Date of Patent: Oct. 18, 2011

(54) ANALOG-TO-DIGITAL CONVERSION IN PIXEL ARRAY

(75) Inventor: Jan Bogaerts, Sint Katelijne Waver (BE)

(73) Assignee: Cmosis NV, Antwerp (BE)

( * ) Notice: Subject to any disclaimer, the term of this patent is extended or adjusted under 35 U.S.C. 154(b) by 106 days.

(21) Appl. No.: 12/696,109

(22) Filed: Jan. 29, 2010

(65) Prior Publication Data

US 2011/0115663 A1    May 19, 2011

(30) Foreign Application Priority Data

Feb. 19, 2009 (GB) .................................. 0902822.6

(51) Int. Cl.
*H03M 1/56* (2006.01)
(52) U.S. Cl. ........................................ 341/169; 341/155
(58) Field of Classification Search .................. 341/118, 341/120, 155, 164, 165, 169
See application file for complete search history.

(56) References Cited

U.S. PATENT DOCUMENTS

| | | | |
|---|---|---|---|
| 7,129,883 B2 * | 10/2006 | Muramatsu et al. | 341/164 |
| 7,556,206 B2 * | 7/2009 | Chivers | 341/118 |
| 7,924,335 B2 * | 4/2011 | Itakura et al. | 348/308 |
| 2007/0216564 A1 * | 9/2007 | Koseki | 341/155 |
| 2010/0245639 A1 * | 9/2010 | Mori | 348/294 |

FOREIGN PATENT DOCUMENTS

GB        2 379 812 A     3/2003

OTHER PUBLICATIONS

British Search Report issued in GB0902822.6 of May 27, 2009, 2 pages.

* cited by examiner

*Primary Examiner* — Howard Williams
(74) *Attorney, Agent, or Firm* — Bacon & Thomas, PLLC

(57) ABSTRACT

An analog-to-digital converter generates an output digital value equivalent to the difference between two analog signals. The converter forms part of a set of converters. The converter receives a first analog signal and a second analog signal ($V_{reset}$, $V_{sig}$) and a ramp signal ($V_{ramp}$). A clock is dedicated to the converter, or a sub-set of converters. A control stage enables a first counter based on a comparison of the ramp signal with the first analog signal and the second analog signal. The converter can be calibrated by at least one reference signal ($V_{ref1}$, $V_{ref2}$) which is common to the set of converters. A-to-D conversion can include a first A-to-D conversion stage which determines a signal range, selected from a plurality of signal ranges, and a second A-to-D conversion stage which determines an M-bit digital value equivalent to the difference between the first and second analog signals by comparing the signals with a ramp signal, with the ramp signal having the signal range determined by the first analog-to-digital conversion stage.

17 Claims, 17 Drawing Sheets

ANALOG-TO-DIGITAL CONVERSION IN PIXEL ARRAY

This application claims the benefit of priority from GB 0902822.6 filed on Feb. 19, 2009.

FIELD OF THE INVENTION

This invention relates to analog-to-digital conversion which can be used in processing signals output from a pixel array.

BACKGROUND TO THE INVENTION

Imaging sensors comprise an array of unit elements (pixels). The array of pixels is exposed to radiation during an exposure period and, subsequently, the signal value of each pixel is read from the array. The array can be a one dimensional array (linear sensor) or a two dimensional array (area array) with pixels arranged in rows and columns.

FIG. 1 shows the typical architecture of a CMOS imaging sensor. Impinging photons are converted into charges in the pixel array 10 and are accumulated during a certain integration period. Typically, the pixels are selected row by row for readout of their signals. A typical four transistor (4T) pixel is shown in FIG. 2. The pixel includes a photodiode PD, a transfer gate to transfer the charges in the photodiode to the floating diffusion FD, a reset transistor M1, a source follower M2 and a row selection transistor M3. The reset transistor M1 is used to reset the floating diffusion FD to a known state before transferring charge from the photodiode PD to it as is known in the art. The source follower M2 converts the charges stored at the floating diffusion FD into an electrical output voltage signal at the column bus. The useful signal outputs of a pixel are analog voltages representing: (i) the reset signal level $V_{reset}$ and (ii) the signal level $V_{sig}$ that is generated after charge transfer from the photodiode. The final signal that represents the amount of photons impinged onto the pixel is the difference signal between these two signals. In the sensor of FIG. 1, there is sample and hold circuitry 15 associated with each column of the array. During the process of reading the array, the sample and hold circuitry 15 for each column stores the two signal values ($V_{reset}$, $V_{sig}$) for a pixel in a selected row. The two signals ($V_{reset}$, $V_{sig}$), or the difference between these signals ($V_{reset}$–$V_{sig}$), must be converted from an analog value to a digital value. In FIG. 1 the analog-to-digital conversion is performed by a single ADC 16 in the output stage of the array and this single ADC 16 is used, on a time-shared basis, by the column circuits. In turn, signal values are transferred from each of the column circuits to the ADC 16 and converted to digital form.

FIG. 3 shows an alternative approach. Analog-to-digital conversion is performed, in parallel, in each column of the array. The single-slope ADC comprises a ramp generator 20 and a synchronous counter 17. Each column has two data latches 18 and a comparator 19. A ramp signal is applied to each of the columns circuits. The ramp signal is distributed to all columns. The counter 17 is incremented in synchronism with the ramp signal such that, at any point in time, the counter 17 provides a digital representation of the analog value of the ramp signal output by the ramp generator 20. The comparator 19 in each column compares the level of the input signal ($V_{reset}$ or $V_{sig}$) against the gradually changing ramp signal. When the ramp voltage reaches the value of the input signal voltage, the comparator 19 output changes state and latches the digital code of the counter into a first memory 18. Afterwards, the same process is repeated for the other of the signals ($V_{reset}$, $V_{sig}$) and the code is latched into a second memory 18. The difference in digital codes is then sent to the output of the sensor.

A refinement of this arrangement is described in U.S. Pat. No. 7,088,279 and U.S. Pat. No. 7,321,329 and shown in FIG. 4. The circuitry associated with each column is provided with a dedicated counter 31 which is able to count in a downwards direction and in an upwards direction. When converting the reset signal $V_{reset}$, the counter 31 counts down until the ramp signal reaches the reset level. The direction of counting of the counter 31 is then switched. During the next ramp signal, the counter 31 counts up until the level of the light induced signal $V_{sig}$ is reached. The technique is depicted in FIG. 5. This architecture has some advantages compared to the conventional architecture. In the conventional architecture, the code generated by counter 17 needs to be distributed over the columns. Column-to-column variations of clock skew, which cause conversion error, are generated when a high-speed clock is used. Both reset level and signal level include offset noise from pixel, column circuitry and comparator, the ADC automatically performs the calculation of the difference between the reset and signal values and no additional subtraction circuitry is required. Ripple counters can be used in this architecture because it is unnecessary for them to be synchronized with the high-speed clock. Column-to-column variations of clock skew and counter delay which cause A/D conversion error are corrected for.

It is desirable that the analog-to-digital conversion occurs as quickly as possible. The rate at which the ADC can operate is limited by several constraints. A significant constraint is the period of the ramp signal against which the analog reset level and signal level are compared. The gradient of the ramp signal $V_{ramp}$ signal can be increased but, for a given resolution (number of bits), it is necessary to proportionally increase the frequency of the master clock that is distributed to the counters in the column processing units. In practice, there is a limit to the clock frequency that can be achieved.

The present invention seeks to provide an alternative way of performing analog-to-digital conversion.

SUMMARY OF THE INVENTION

A first aspect of the present invention provides an analog-to-digital converter for generating an output digital value equivalent to the difference between two analog signals. The converter forms part of a set of converters. The converter comprises at least one input for receiving a first analog signal and a second analog signal and an input for receiving a ramp signal. The converter also comprises a clock which is arranged to generate a clock signal. The clock is dedicated to the converter, or a sub-set of converters in the set of converters. The converter also comprises a first counter which is operable to accumulate a count of clock cycles when enabled. The converter also comprises a control stage which is arranged to enable the first counter based on a comparison of the ramp signal with the first analog signal and the second analog signal.

This aspect of the invention can have an advantage of allowing a faster, more accurate, conversion because no rapidly-varying signals are distributed to the set of converters. Instead, each converter uses a clock which is local to the converter. The clock can be a dedicated clock for that converter, or shared by a sub-set of the converters. The counter in each converter, when enabled, counts cycles of the local clock. The accumulated count represents a difference between the two analog signals.

Advantageously, the set of converters are calibrated by a reference signal, or reference signals, which are distributed to the set of converters. Calibration can be achieved by accumulating a count of clock cycles within a time period which is common to the set of converters. The time period can be defined by an enable signal which is distributed to the set of counters, or by DC reference signals which are distributed to the set of converters. Each converter compares the DC reference signals with the ramp signal to derive a count of clock cycles during the period between the ramp signal crossing the first reference signal and the second reference signal.

A new calibration can be performed every time that the analog signals are converted, or can be performed less frequently, such as once every image frame.

The analog-to-digital converter performs the conversion during a conversion cycle. The conversion cycle can make use of a ramp signal having two cycles, or just a single cycle. The use of a single ramp cycle can reduce the conversion time as both of the analog signals are compared with the same cycle of the ramp signal. The comparison of the first and second analog signals with the ramp signal can occur concurrently or sequentially during the ramp signal. The control stage can be arranged to enable the first counter and the second counter during different portions of a cycle of the ramp signal. The different portions can be contiguous portions of a cycle of the ramp signal.

Advantageously, the converter further comprises a ramp generator for generating the ramp signal, wherein the ramp generator is dedicated to the converter, or a sub-set of converters in the set of converters.

Advantageously, the converter further comprises: a first analog-to-digital conversion stage which is arranged to determine a signal range, selected from a plurality of signal ranges, based on at least the first analog signal; a second analog-to-digital conversion stage comprising the converter according to any one of the preceding claims which is arranged to determine an M-bit digital value equivalent to the difference between the first and second analog signals by comparing the signals with a ramp signal, wherein the ramp signal has the signal range determined by the first analog-to-digital conversion stage; and wherein the output digital value comprises the M-bit digital value determined by the second analog-to-digital conversion stage, scaled by a factor dependent on the signal range determined by the first analog-to-digital conversion stage.

Advantageously, the signal ranges are scaled by a factor of two with respect to one another and wherein the output digital value comprises the M-bit digital value determined by the second analog-to-digital conversion stage shifted by a number of bits dependent on the signal range determined by the first analog-to-digital conversion stage.

The analog-to-digital converter can be used to process an output of a pixel or a group of pixels (e.g. a column) of an imaging array. The analog-to-digital converter can be also used in a 3D integrated sensor. A 3D integrated sensor is a sensor that is built up from multiple chips that are stacked on top of each other. For example, a first chip contains the pixel photodiodes or pixel circuitry. This chip is bonded to a second chip containing readout circuitry (e.g. analog processing circuits or ADCs) and so on.

Another aspect of the invention provides a method of generating an output digital value equivalent to the difference between two analog signals at a converter which forms part of a set of converters, the method comprising:
 receiving a first analog signal and a second analog signal;
 receiving a ramp signal;
 generating a clock signal, the clock signal being dedicated to the converter, or a sub-set of converters in the set of converters;
 determining a first count of cycles of the clock signal during a time period which is based on a comparison of the ramp signal with the first analog signal and the second analog signal.

Advantageously, the method further comprises:
 receiving at least one reference signal;
 determining a second count of cycles of the clock signal during a time period which is based on a comparison of the ramp signal with the at least one reference signal;
 calibrating the first count using the second count Another aspect of the invention provides an analog-to-digital converter for generating an output digital value equivalent to the difference between two analog signals, the converter comprising: a first analog-to-digital conversion stage which is arranged to determine a signal range, selected from a plurality of signal ranges, based on at least the first analog signal; a second analog-to-digital conversion stage which is arranged to determine an M-bit digital value equivalent to the difference between the first and second analog signals by comparing the signals with a ramp signal, the ramp signal using the range determined by the first analog-to-digital conversion stage; and wherein the output digital value comprises the M-bit digital value determined by the second analog-to-digital conversion stage, scaled by a factor dependent on the signal range determined by the first analog-to-digital conversion stage.

Advantageously, the first analog-to-digital conversion stage is arranged to determine the signal range based on a difference between the first and second analog signals.

Analog-to-digital converters which are used in a stand-alone manner (i.e. not forming part of a set of converters) can suffer from a problem that the clock within the converter operates at a frequency which varies with temperature and voltage. A further aspect of the invention provides an analog-to-digital converter for generating an output digital value equivalent to the difference between two analog signals, the converter comprising:
 at least one input for receiving a first analog signal and a second analog signal;
 a ramp generator for generating a ramp signal;
 a clock which is arranged to generate a clock signal;
 a reference signal generator for generating first and second reference signals;
 a first counter which is operable to accumulate a count of clock cycles when enabled;
 a second counter which is operable to accumulate a count of clock cycles when enabled;
 a control stage which is arranged to:
  enable the first counter based on a comparison of the ramp signal with the first analog signal and the second analog signal;
  enable the second counter based on a comparison of the ramp signal with the first reference signal and the second reference signal
 logic which is arranged to use the value accumulated by the second counter to calibrate the value accumulated by the first counter.

This can allow the use of an extremely high frequency (e.g. gigahertz frequency range) clock within the converter. The count accumulated by the second counter calibrates the count accumulated by the first counter. This can result in a lower power, or faster, A-to-D conversion than one with a known and stabilized clock frequency.

Another aspect of the invention provides a corresponding method of generating an output digital value equivalent to the difference between two analog signals at a converter, the method comprising:

receiving a first analog signal and a second analog signal;
generating a ramp signal;
generating a clock signal;
generating a first reference signal and a second reference signal;
determining a first count of cycles of the clock signal during a time period which is based on a comparison of the ramp signal with the first analog signal and the second analog signal;
determining a second count of cycles of the clock signal during a time period which is based on a comparison of the ramp signal with the first reference signal and the second reference signal;
calibrating the first count using the second count.

BRIEF DESCRIPTION OF THE DRAWINGS

Embodiments of the invention will be described, by way of example only, with reference to the accompanying drawings in which.

DESCRIPTION OF PREFERRED EMBODIMENTS

Figure 1:
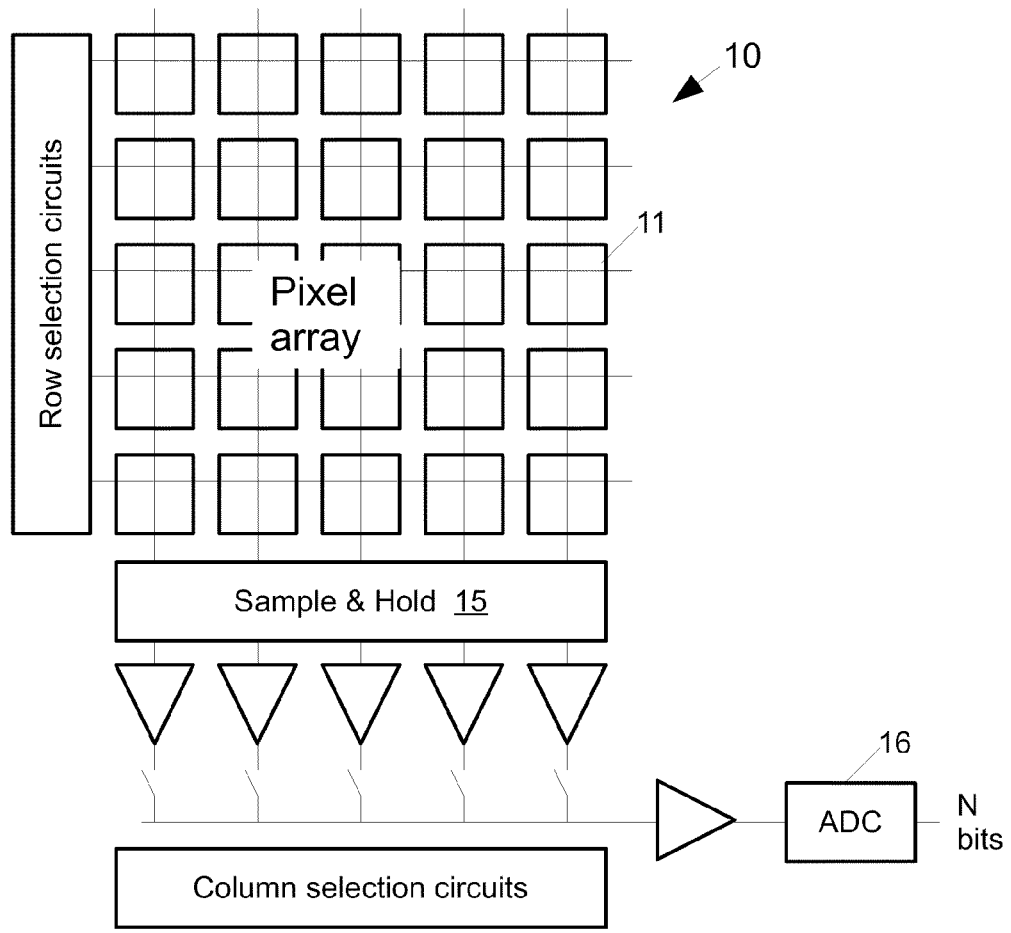
FIG. 1 shows a known architecture of an imaging sensor comprising a pixel array, a column circuit for each column of the pixel array and a single output ADC.
Figure 2:
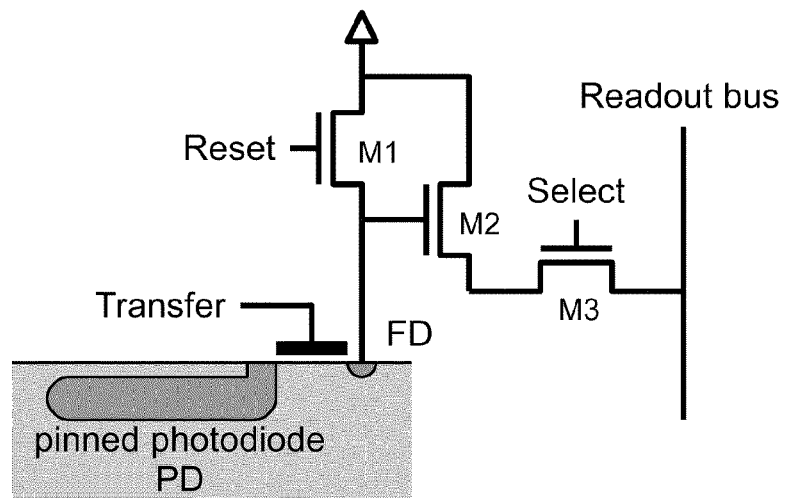
FIG. 2 shows a four transistor (4T) active pixel sensor for use in the array of FIG. 1.
Figure 3:
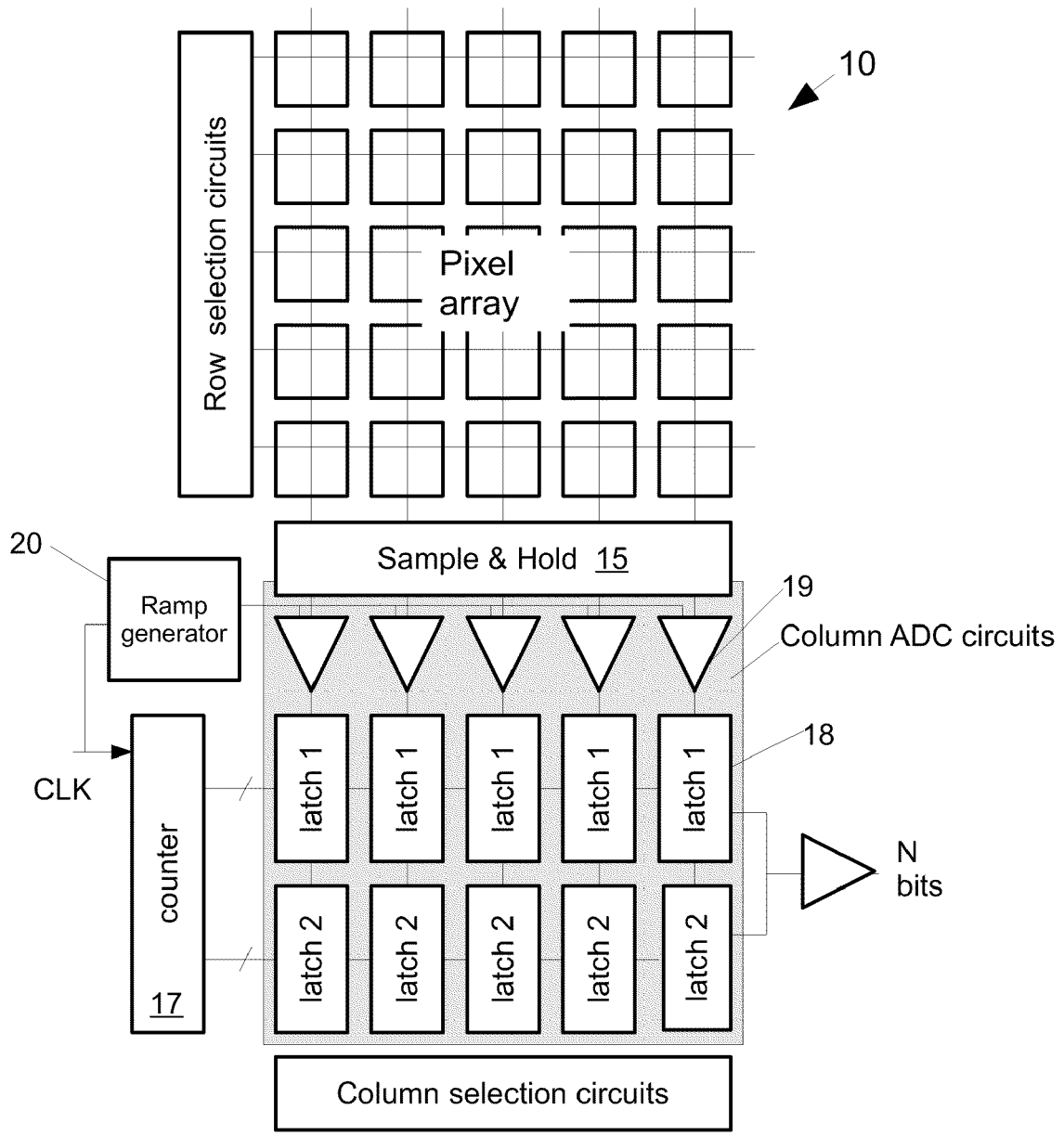
FIG. 3 shows an alternative known architecture of an imaging sensor comprising a pixel array and a column circuit for each column of the pixel array, where analog-to-digital conversion is performed in each column circuit using a ramp signal and a counter which are distributed to each column circuit.
Figure 4:
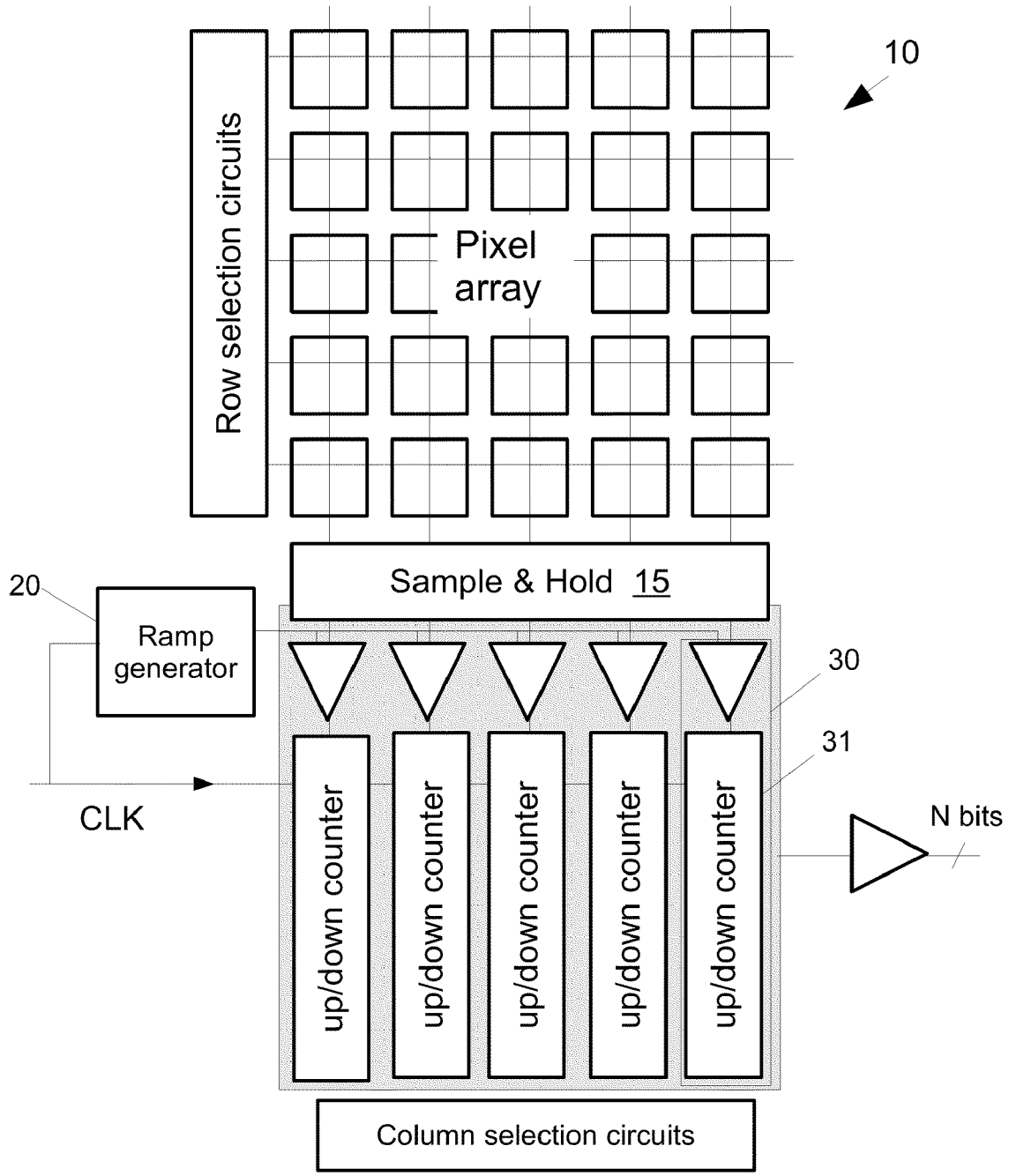
FIG. 4 shows an alternative known architecture of an imaging sensor comprising a pixel array and a column circuit for each column of the pixel array, where analog-to-digital conversion is performed in each column circuit using a distributed ramp signal and a counter in each column circuit which counts in both downward and upward directions.
Figure 5:
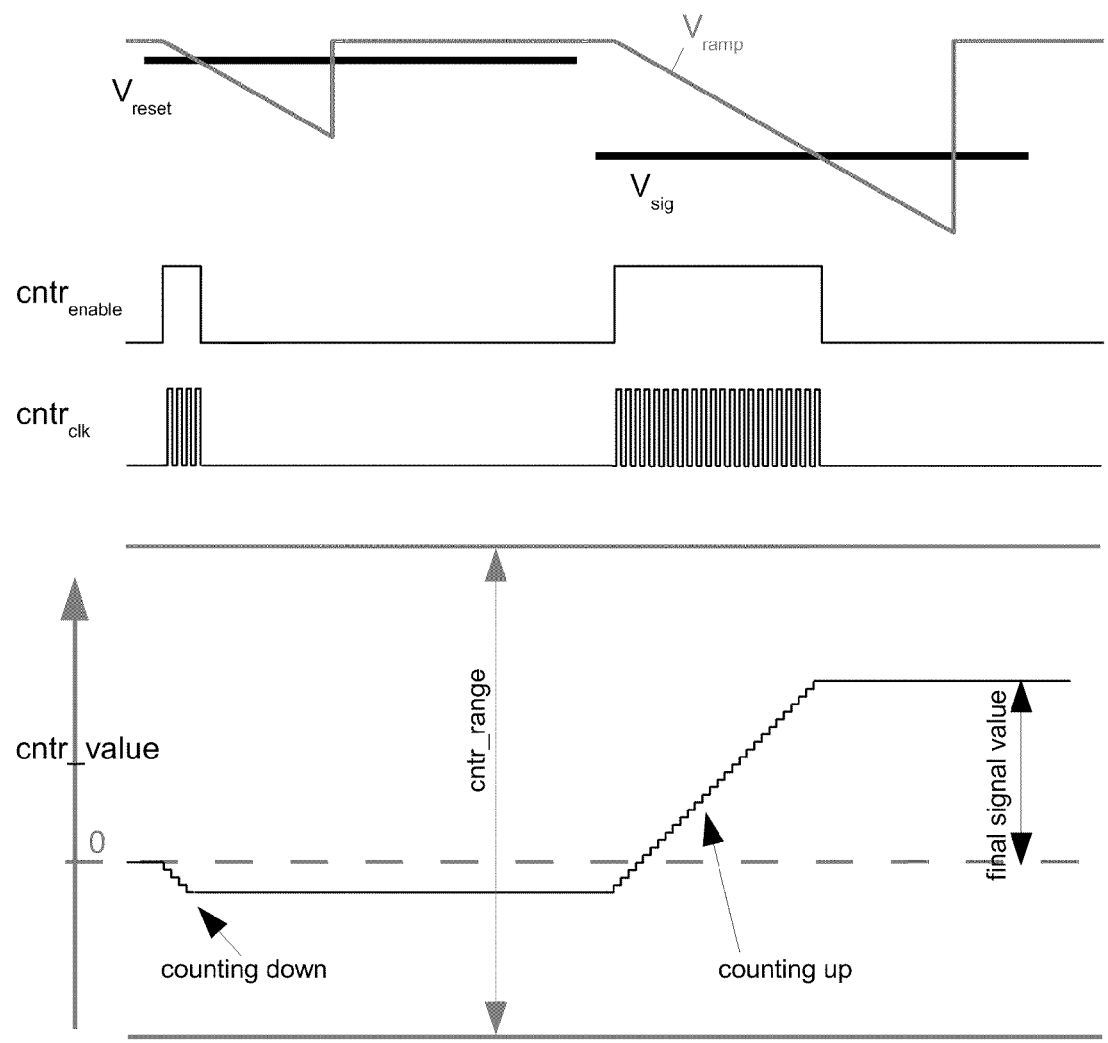
FIG. 5 shows operation of the column circuit of FIG. 4 to derive a digital count value corresponding to a difference between two analog signal values.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Throughout this specification, it should be noted that the term "row" and "column" can be interchanged. Also, the term "row" does not imply a particular orientation of the array.

Figure 6:
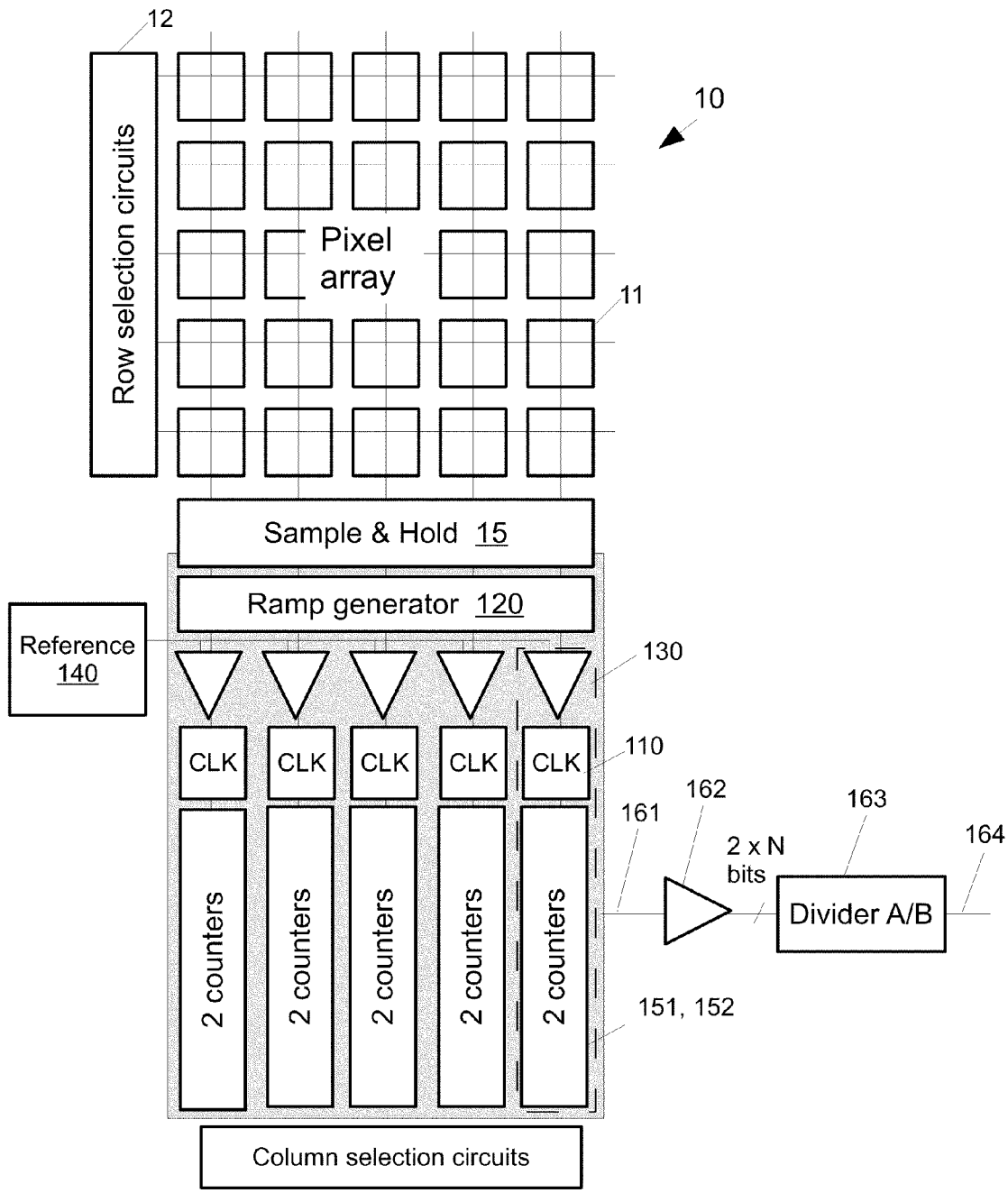
FIG. 6 shows an architecture of an imaging sensor according to an embodiment of the present invention.

FIG. 6 schematically shows an architecture for analog to digital conversion of signals from a pixel array 10. The pixel array is the same as previously shown in FIGS. 1 to 4 and comprises an array of pixels 11 which are responsive to radiation (typically light). Two analog signal values are read from each of the pixels 11 in the array 10: (i) a reset signal level $V_{reset}$ and (ii) a signal level $V_{sig}$ that is generated after charge transfer from the photodiode. Sample and hold circuitry 15 is provided for each column of the array, and stores the two signal values ($V_{reset}$, $V_{sig}$) for a pixel in a selected row. The difference between these two analog signals ($V_{reset}$-$V_{sig}$) is converted from an analog value to a digital value by column processing circuit 130.

A set of column processing circuits 130 are arranged in parallel. Each column processing circuit 130 performs the analog-to-digital conversion just described for a column of the pixel array 10. Circuitry 140 outputs DC reference signals which are distributed to each of the set of column processing circuits 130. In principle, these can be any DC voltages and they are used as a reference for calibrating the set of column processing circuits 130. A ramp generator 120 generates a ramp signal. The ramp generator 120 can be a global resource, generating a ramp signal which is distributed to all column processing stages, or it can be a more local resource, which is associated with a sub-set of the columns, or a single column. A clock signal is generated locally at each column processing circuit 130. The clock signal can be generated by a simple ring oscillator 110. Each column processing circuit 130 also has two counters 151, 152 which, when enabled, count clock cycles of the local clock 110. The column processing circuits output digital values accumulated by their respective counters. Typically, data is transferred from each column processing circuit 130 on a time-multiplexed basis and output 161 to output circuitry 162, 163. FIG. 6 shows an amplifier 162 and a divider 163 which divides the pair of N-bit digital values output by each column processing circuit 130, and outputs the resulting digital value 164. In an integrated sensor the column processing circuits 130 are typically integrated with the pixel array 10, although they can be provided as a separate physical circuit from the pixel array.

Figure 7A:
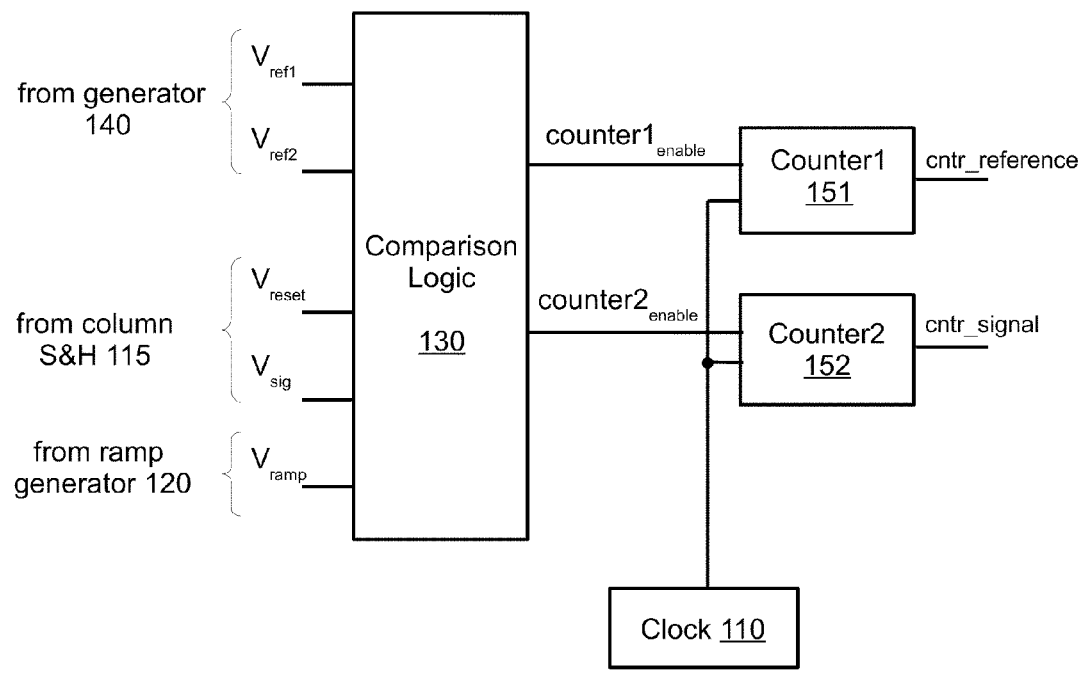
FIGS. 7A and 7B show conversion apparatus at each column of the sensor.

FIG. 7A shows a column processing circuit in more detail. Comparison logic 130 receives a set of signals. These include:

DC reference signals $V_{ref1}$, $V_{ref2}$ received from generator 140; analog pixel signals $V_{reset}$, $V_{sig}$ received from sample and hold circuitry 115 of the column; and a ramp signal $V_{ramp}$ received from ramp generator 120. Comparison of these signals (described below) generates two digital signals counter1_enable, counter2_enable, which control operation of respective counters Counter1 151, Counter2 152. Counter1 outputs a digital count cntr_reference and Counter2 outputs a digital count cntr_signal. A locally generated clock signal 110 is applied to both counters.

Figure 8A:
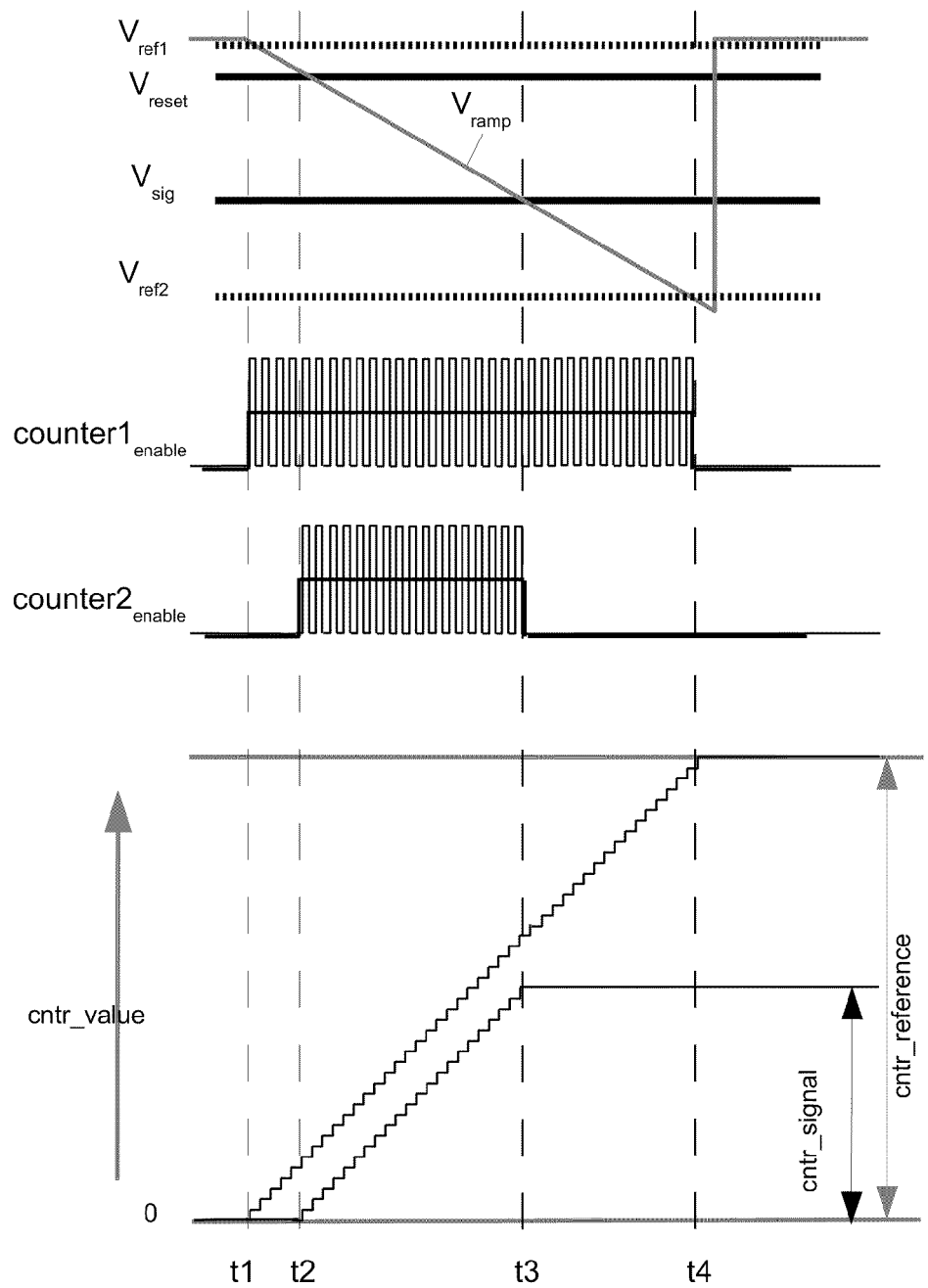
FIGS. 8A and 8B show operation of the conversion apparatus of FIGS. 7A and 7B.

Operation of a column processing stage is shown in FIG. 8A. Two analog pixel signal values are shown: $V_{reset}$ is the reset level of the pixel and $V_{sig}$ is the signal level of the pixel. A ramp signal $V_{ramp}$ spans a range of values, the range extending across the reference signals $V_{ref1}$, $V_{ref2}$ and the expected range of the pixel signals $V_{reset}$, $V_{sig}$. In the example of FIG. 8 the reference signals $V_{ref1}$, $V_{ref2}$ are outside the range of the pixel signals, and therefore the ramp signal $V_{ramp}$ has a range with a higher value which is greater than $V_{ref1}$ and a lower value which is less than $V_{ref2}$. The reference signals $V_{ref1}$, $V_{ref2}$ can be set to any level since they are used for calibration of ramp slope and clock frequency. FIG. 12 shows an example where reference signal $V_{ref1}$ is below $V_{reset}$.

The ramp signal begins a cycle and, at time t1, the ramp signal crosses the level of the upper reference voltage $V_{ref1}$. The local clock and counter1 are started. The counter enable signal counter1$_{enable}$ (shown as a solid line) is shown together with the clock signal which it enables. At time t2 the ramp signal crosses the level of the reset pixel signal value $V_{reset}$ and counter2 is started. At time t3 the ramp signal crosses the level of the pixel signal value $V_{sig}$ and counter2 is stopped. The accumulated count represents the pixel value ($V_{reset}$ - $V_{sig}$). At time t4 the ramp signal crosses the level of the lower reference signal $V_{ref2}$ and counter1 is stopped. The ratio of the values accumulated by the counters counter1, counter2 gives the final signal conversion value:

$$\text{Final signal value} = \frac{\text{cntr\_signal}}{\text{cntr\_reference}}$$

The final signal value is advantageously calculated by output circuitry (163, FIG. 6) which is shared by the set of column processing circuits 130. Alternatively, each column processing circuit 130 can include circuitry to calculate the final signal value. An advantage of using a local clock and/or ramp signal is that the conversion time can be much shorter, because the high frequency clock signal is generated locally to where it is used. In conventional architectures the distribution of a fast clock and a ramp signal to a set of column processing stages is limited by factors such as RC delay times and/or power consumption (more or less need for synchronous operation of all columns depending on the architecture) and the maximum clock frequency is typically limited to a few hundreds of MHz. A local clock can operate at a few GHz, with a simple ring oscillator in 0.18 μm technology. The technique described here is insensitive to clock frequency variations or differences in ramp slope between columns. The DC reference voltages $V_{ref1}$, $V_{ref2}$ are the same for each column processing stage 103. Although different column processing stages have separate clocks which may run at slightly different frequencies, and use ramp signals which may differ in their slope, the operation of taking the ratio between the two accumulated counts cancels any non-uniformity between the clock frequencies and slopes of the ramp signal in different column processing stages 130.

FIGS. 6 and 7A show a local clock 110 which is dedicated to a column processing circuit 130. In other arrangements, the clock 110 can be shared by a sub-set of the total set of converters, but the propagation distance of the clock signal is advantageously kept as short as possible.

It is possible to leave the local clocks running continuously, and to enable/disable the counters. Alternatively, the local clocks can be turned off when not required to save power consumption. In practice, it is desirable to start the clocks slightly before any conversion to avoid transient effects, i.e. to make sure that the clock is running with a stable frequency before making use of it, and turn off the clocks slightly after the conversion has finished.

One requirement to maximise the accuracy of the conversion is that the clock frequency and ramp signal slope should be as consistent as possible between the conversion of the reference signal levels and the conversion of the pixel signal levels. In FIG. 8 this is achieved by converting both the reference signal and the pixel signal during a single cycle of the ramp signal $V_{ramp}$. An alternative scheme performs the conversion during two cycles of the ramp signal. In a first cycle, the reference signal is converted by enabling a counter at time t1 and disabling the counter at time t4 (as shown in FIG. 8) to accumulate a count representing the number of clock cycles for the time it takes the ramp signal to cross the reference signal levels. In a second cycle, a counter is enabled at time t2 and disabled at t3 to accumulate a count representing the number of clock cycles for the time it takes the ramp signal to cross the pixel signal values $V_{signal}$, $V_{reset}$. The measurement of the difference between the reference signal levels does not need to be performed each time that the pixel signals are converted, and can be performed less frequently, such as only once per frame of image data. Factors which determine how often the reference measurement needs to be performed include: stability of the clock frequency; stability of the ramp signal; the required accuracy of the conversion.

The counts accumulated by the counters counter1, counter 2 can be expressed as:

$$cntr_{signal} = \frac{(V_{reset} - V_{sig}) \times f_{localclock}}{S_{ramp}}$$

$$cntr_{reference} = \frac{(V_{ref1} - V_{ref2}) \times f_{localclock}}{S_{ramp}}$$

where $f_{local\,clock}$ is the frequency of the local clock (in Hz) and $S_{ramp}$ is the slope of the ramp signal (in V/s). The reference signals ($V_{ref1}$ and $V_{ref2}$) are global and therefore constant for all columns. From the above equations, it follows that the converted pixel signal can be retrieved as:

$$(V_{reset} - V_{sig}) = (V_{ref1} - V_{ref2}) \times \frac{cntr_{signal}}{cntr_{reference}}$$

As can be seen from this equation, all dependencies related to local circuits are calibrated out. This method is therefore insensitive to the exact clock frequency and slope of the ramp signal as long as they are the same for the conversion of the signal and the reference. Mismatches between columns are calibrated out.

Figure 12A:
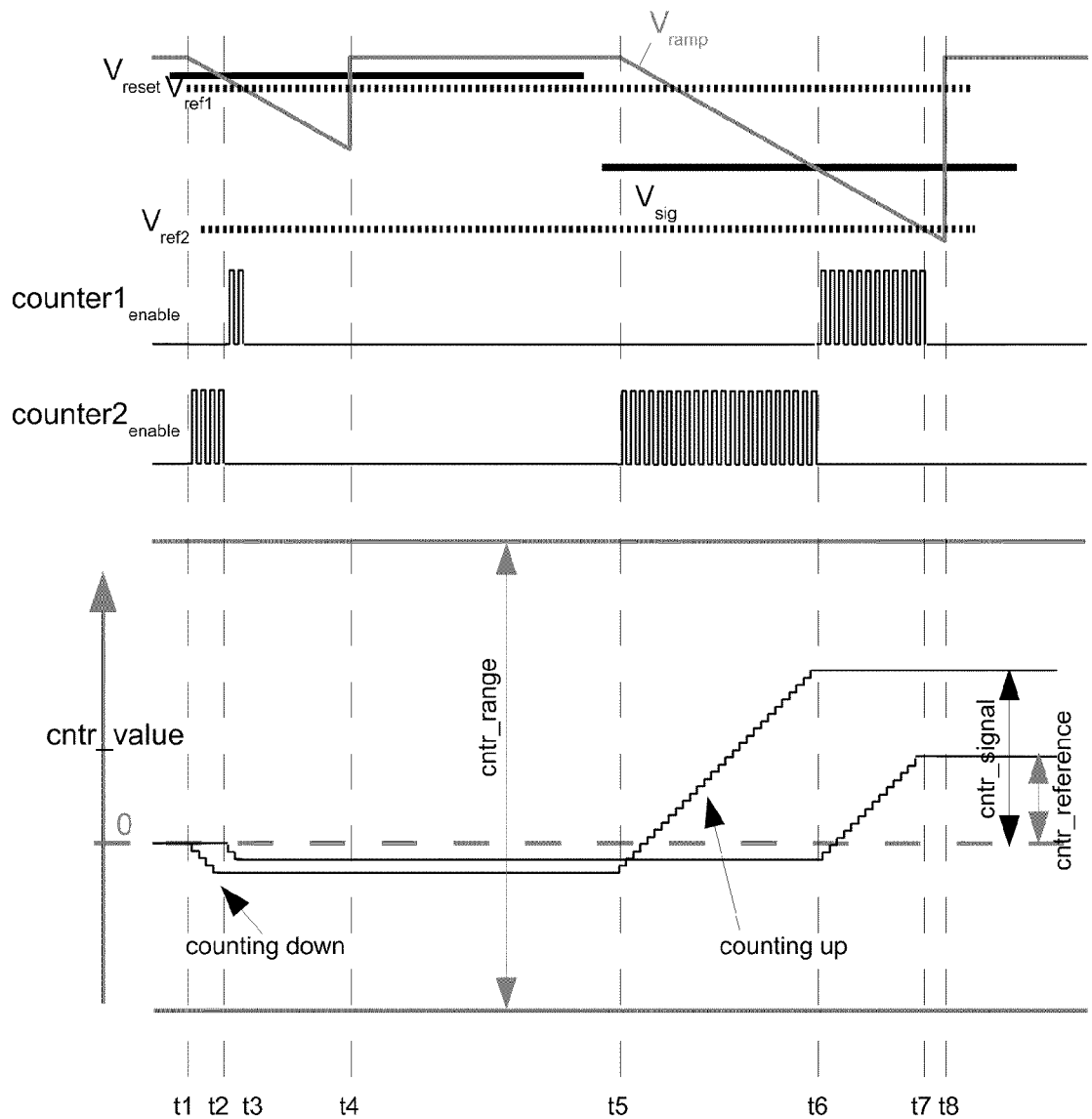
FIGS. 12A and 12B show operation of the conversion apparatus over two cycles of a ramp signal.
Figure 12B:
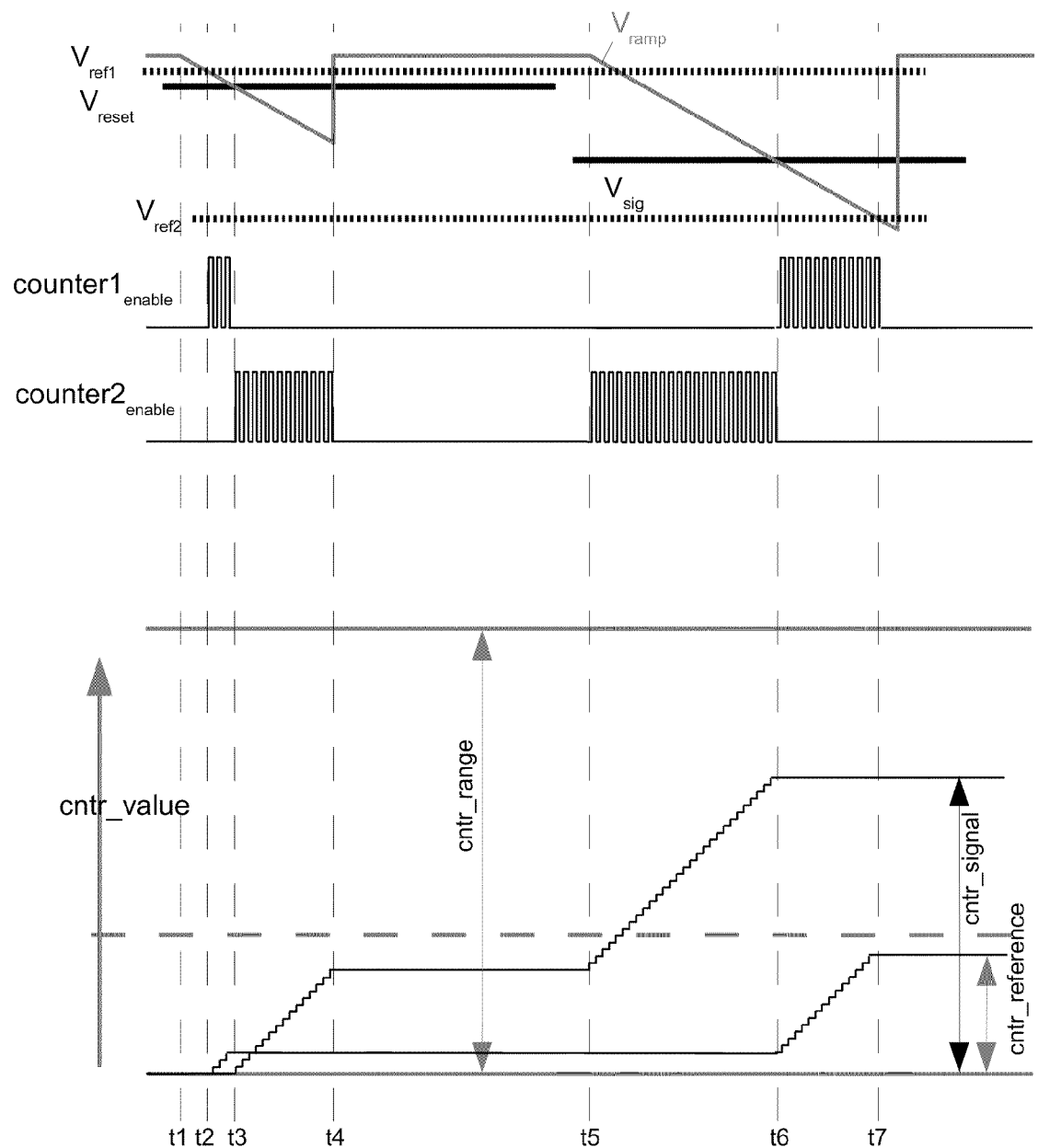

In FIG. 8A the two pixel signals $V_{reset}$, $V_{sig}$, and the two reference signals $V_{ref1}$, $V_{ref2}$ are all compared with the ramp signal $V_{ramp}$ during one cycle of the ramp signal. It is also possible to perform the conversion of the signals during multiple cycles (or phases) of the ramp signal. The ramp signal does not need to span the same range of values during each of the phases. This will become clearer when the examples of FIGS. 12A and 12B are explained.

Figure 7B:
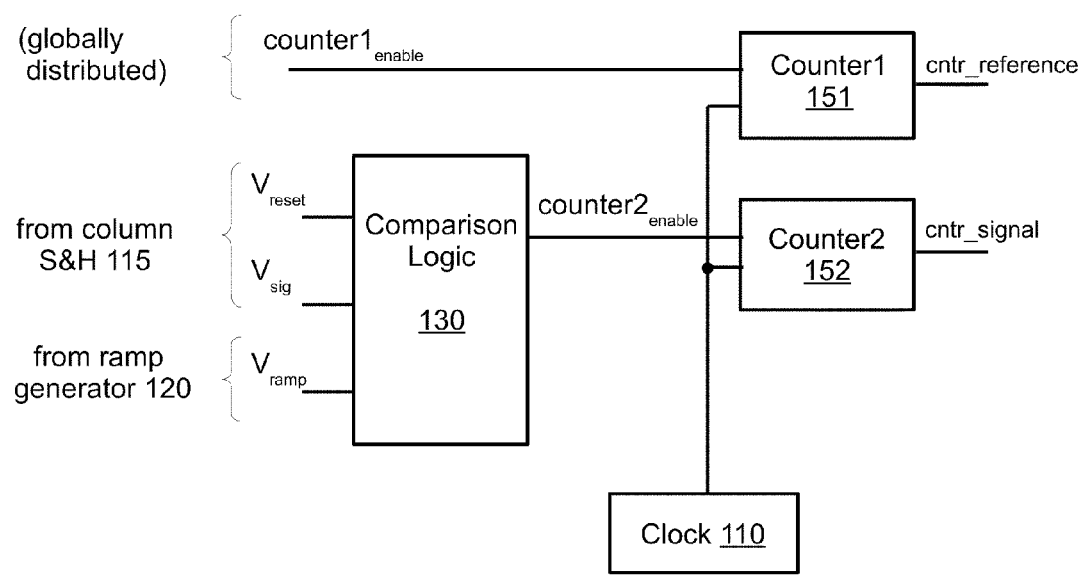
Figure 8B:
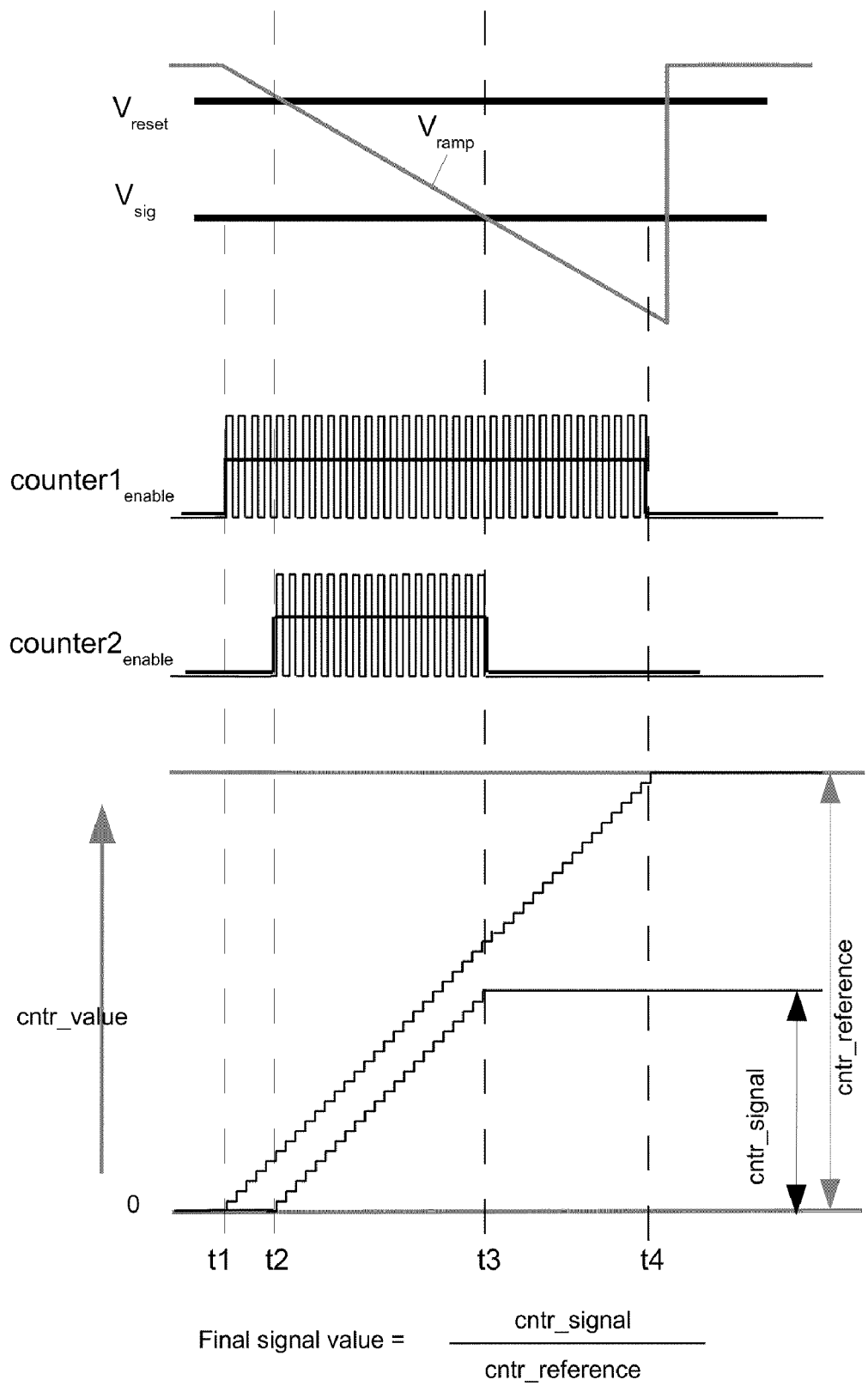

In the scheme described above two DC reference levels $V_{ref1}$, $V_{ref2}$ are distributed to the set of column processing circuits 130. FIGS. 7B and 8B show an alternative scheme in which a global enable signal counter1$_{enable}$ is distributed to the set of column processing circuits 130. The global enable signal has a stable pulse width, which is the same for each column processing circuit 130. In this scheme it only necessary to compare the ramp signal $V_{ramp}$ with the pixel signal levels $V_{reset}$, $V_{sig}$. The corresponding equations are:

$$cntr_{signal} = \frac{(V_{reset} - V_{sig}) \times f_{localclock}}{S_{ramp}}$$

(this is unchanged), and:

$$cntr_{reference} = (T_{rising} - T_{falling}) \times f_{localclock}$$

where $f_{local\,clock}$ is the frequency of the local clock (in Hz) and $S_{ramp}$ is the slope of the ramp signal (in V/s). From the above equations, it follows that the converted pixel signal can be retrieved as:

$$(V_{reset} - V_{sig}) = \frac{cntr_{signal}}{cntr_{ref}} \times S_{ramp} \times (T_{rising} - T_{falling})$$

It can be seen that the ramp slope $S_{ramp}$ does not cancel from the equation, and therefore the ramp slope must be the same for the set of column processing circuits. This can be achieved with a single ramp generator which distributes a ramp signal to the set of column processing circuits, or by accurately aligned ramp generators. This scheme may offer less accuracy compared with the scheme which uses DC reference levels because the global enable signal can become distorted as it is distributed across the set of column processing circuits, especially at higher frequencies and with a large number of column processing circuits. A further disadvantage is the need for a ramp signal which has a uniform slope value across the set of column processing circuits.

Figure 9:
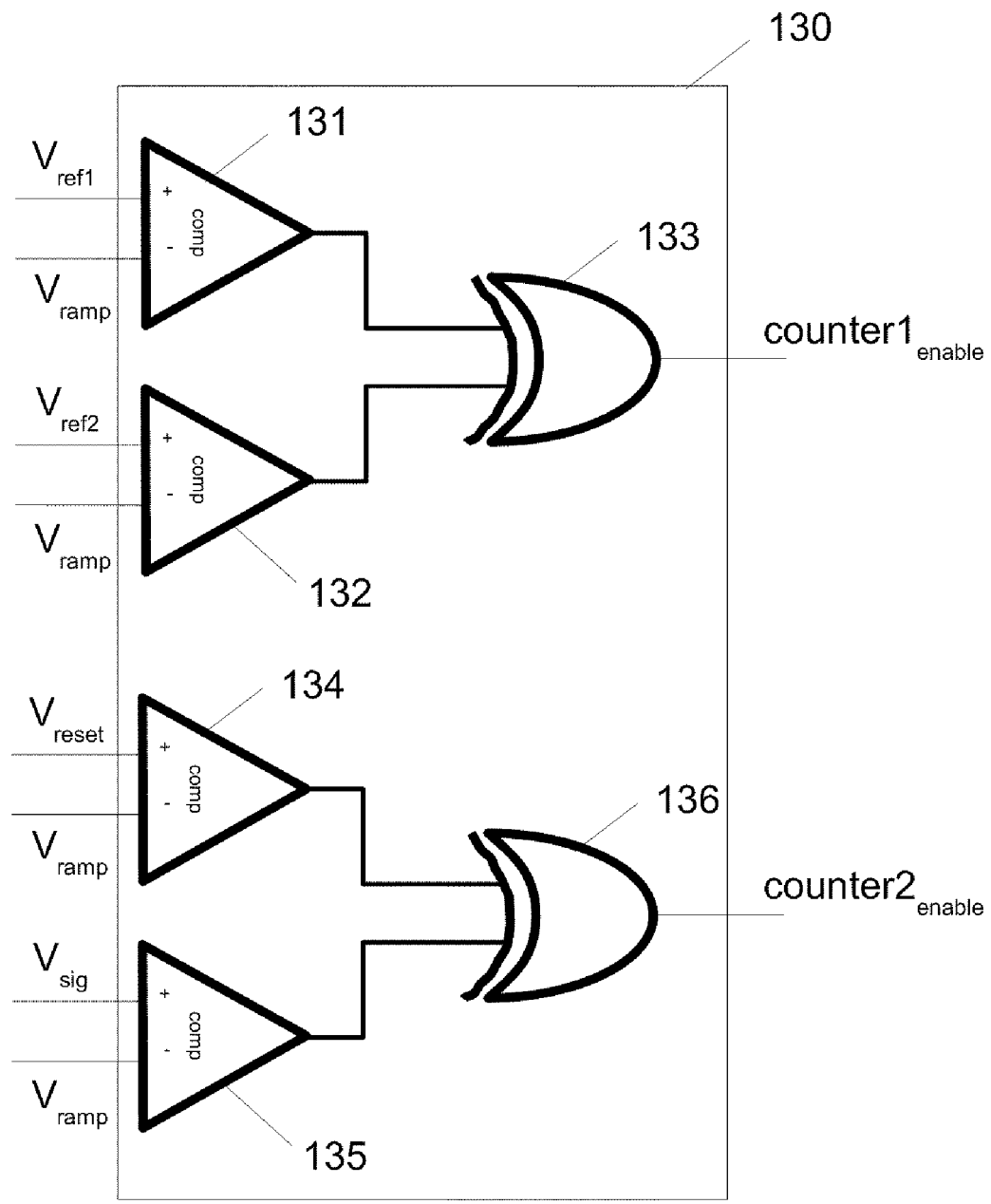
FIG. 9 shows comparison logic for use in the apparatus of FIG. 7.
Figure 10A:
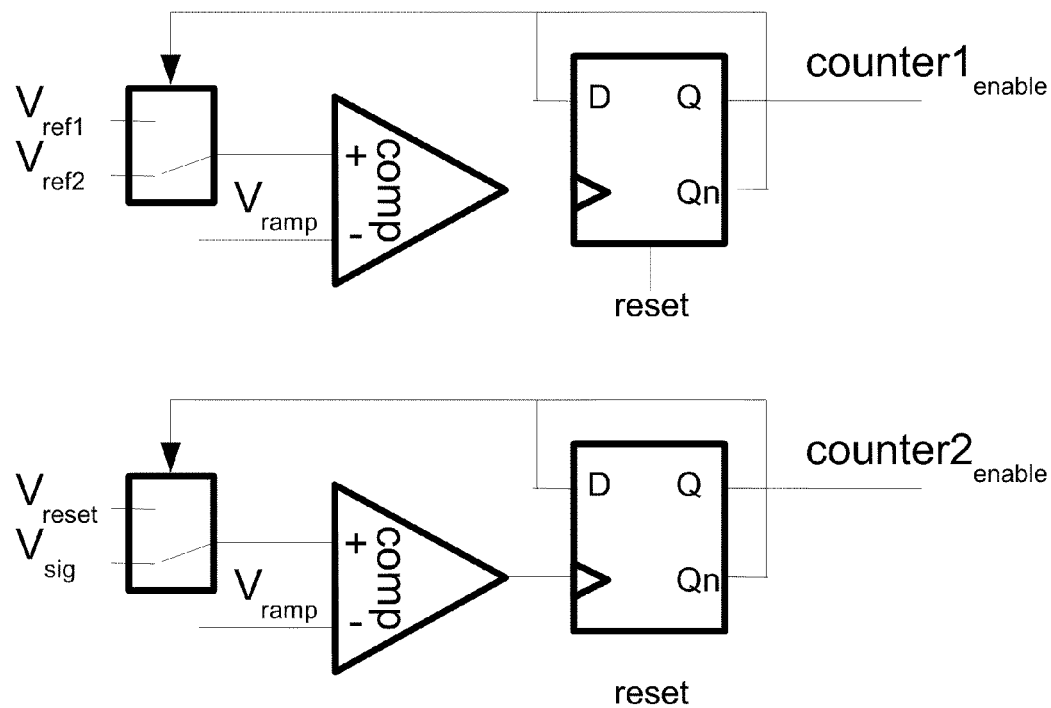
FIGS. 10A and 10B each show alternative comparison logic for use in the apparatus of FIG. 7.
Figure 10B:
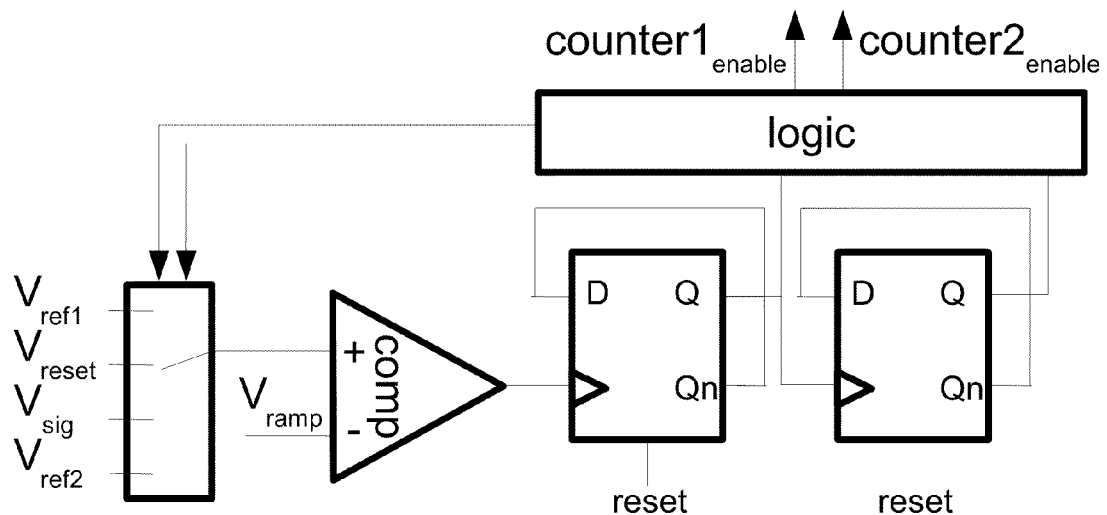

FIGS. 9 and 10 show two possible implementations of the comparison logic 130. In FIG. 9 a set of four comparators 131, 132, 134, 135 is used. The two pixel signals $V_{reset}$, $V_{sig}$ to be converted (or the difference between these two signals) are made available concurrently, e.g. by sample and hold circuitry 115 at the output of the column. Comparators 131, 132 each compare one of the reference signals with the ramp signal $V_{ramp}$. An exclusive OR gate 133 enables the control signal counter1$_{enable}$ for counter1 when the ramp signal $V_{ramp}$ is less than $V_{ref1}$ and greater than $V_{ref2}$. Similarly, Comparators 134, 135 each compare one of the pixel signals with the ramp signal $V_{ramp}$. An exclusive OR gate 136 enables the control signal counter2$_{enable}$ for counter2 when the ramp signal $V_{ramp}$ is less than $V_{reset}$ and greater than $V_{sig}$. All of the comparators (131, 132, 134 and 135) have their own offset. These offsets can be calibrated and stored periodically (e.g. each frame or at start-up of the sensor) by setting the corresponding signal levels to known levels and storing the result which is then systematically subtracted from each measurement. Typically the value to be subtracted will be only a few bits, with subtraction performed at the output or during initialisation of the counters. The following schemes shown in FIGS. 10A and 10B do not require the calibration cycle.

FIGS. 10A and 10B show alternative implementations of the comparison logic 130. At the start of the conversion, the reset signal makes the counter2$_{enable}$ signal low and the positive input of the comparator is switched to $V_{reset}$. When the ramp signal $V_{ramp}$ goes below $V_{reset}$, the comparator output goes high and the flip-flop toggles. The counter2$_{enable}$ signal goes high (and the counter starts counting). The positive input of the comparator is also switched to $V_{sig}$, making the output of the comparator low again. When the ramp signal goes below $V_{sig}$, the comparators output goes high again and the flip-flop toggles again, now finishing the counting period. This works if the offset between $V_{reset}$ and $V_{sig}$ is large enough, and has the advantage that the comparator offset is cancelled. Another set of the logic operates on the reference signals $V_{ref1}$, $V_{ref2}$ to generate the counter2$_{enable}$ signal in a similar way as just described. FIG. 10B shows an alternative scheme with a 4:1 multiplexer and a single comparator and is particularly useful for the conversion scheme of FIG. 11.

In situations where the local clocks 110 are fairly stable, the count of clock cycles occurring during the reference period (either defined by reference levels as in FIG. 8A, or by a global enabling signal as in FIG. 8B) can be performed less frequently than the count of the pixel signals. The reference count can be made during a dedicated calibration cycle, during which only the reference count is accumulated. In this case, it is possible to have just a single counter device which is used on a time-shared basis to: (i) accumulate a count of clock cycles for calibration purposes; (ii) accumulate a count of clock cycles for normal measurement purposes. In this option, the two counters 151, 152 shown in FIGS. 7A and 7B are implemented by a single counter device on a time-shared basis.

Quasi-Constant Power Consumption

Figure 11:
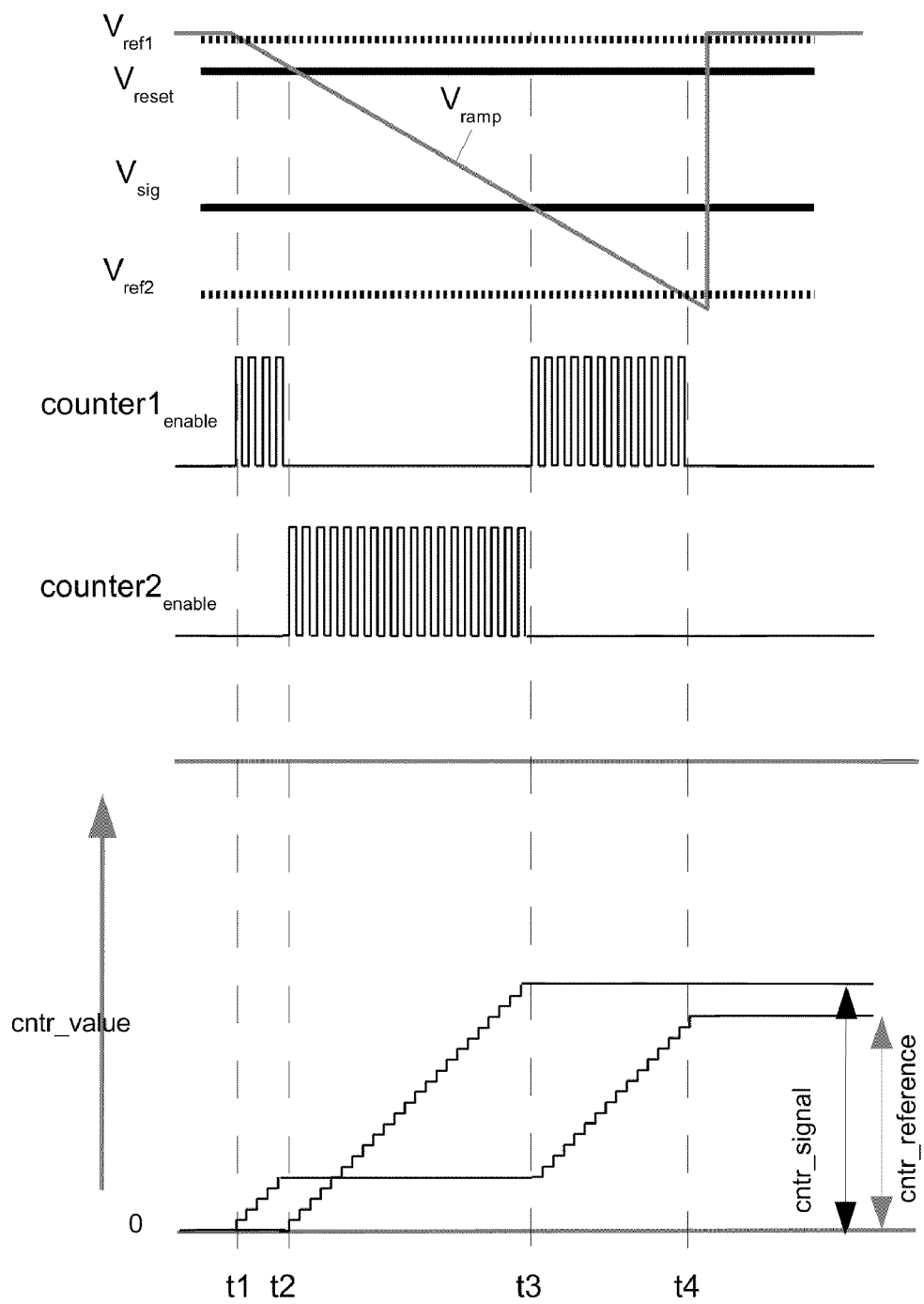
FIG. 11 shows operation of the conversion apparatus to achieve a quasi-stationary power requirement.

FIG. 8A shows simultaneous conversion of the reference range ($V_{ref1}$–$V_{ref2}$) and the pixel signal ($V_{reset}$–$V_{sig}$). A possible issue is that the power consumption during this conversion is signal dependent since two clocks/counters are operated at the same time. This is because a significant fraction of the power consumption is for the clock generator and LSBs of the counter since these generate toggling most frequently. This signal dependent current consumption may cause signal dependent voltage drops in the power supply lines which, in turn, can cause a varying oscillating frequency during the conversion process. Neighbouring columns may therefore also influence each other (causing signal dependent non-linearities for example). FIG. 11 shows a way to avoid this. Conversion of the reference signals and pixel signals is performed during a single cycle of the ramp signal. The reference levels $V_{ref1}$, $V_{ref2}$ are chosen such that the reference range encloses the pixel value range, i.e. $V_{ref1}$ is higher than $V_{reset}$ and $V_{ref2}$ is lower than $V_{sig}$. A single clock generator is used and the counter logic is configured such that only one counter is active at any time and that this power consumption lasts for approximately the same period for all columns. This gives a quasi-constant power consumption. The voltage drops and clock frequencies are therefore quasi-constant during the complete conversion process.

The ramp signal begins and, at time t1, the ramp signal crosses the level of the upper reference voltage $V_{ref1}$. The local clock and counter1 are started. At time t2 the ramp signal crosses the level of the reset pixel signal value $V_{reset}$. Counter 1 is stopped and counter2 is started. At time t3 the ramp signal crosses the level of the pixel signal value $V_{sig}$. Counter2 is stopped and counter1 is enabled, so that it continues to count from the value accumulated at time t2. At time t4 the ramp signal crosses the level of the lower reference signal $V_{ref2}$ and counter1 is stopped. The accumulated count of counter1 represents the difference ($V_{ref1}-V_{ref2}$). The accumulated count of counter2 represents the pixel value ($V_{reset}-V_{sig}$). The final signal value is given by:

$$\text{Final signal value} = \frac{\text{cntr\_signal}}{\text{cntr\_reference} + \text{cntr\_signal}}$$

Note that the signal offset and ADC gain can be different depending on the scheme used. For example, if the final signal value is calculated as given by the equations above, cntr_signal and cntr_reference may have different values for the same input signals Vreset and Vsig, depending on which of the conversion schemes is used (FIGS. 8, 11, 12 etc) because in some schemes an intentional offset is used (between input signals) or the reference values are chosen differently. This translates in different offset and gain, which is not an issue for digital data.

In FIGS. 12A and 12B a ramp signal has an overall cycle (t1-t8) which is divided into two phases (t1-t4) and (t5-t8). During each phase one reference signal and one pixel signal are compared with the ramp signal. It can be seen that the ramp signal can have a smaller range in one of the phases, which helps to reduce the overall time of the conversion cycle. FIG. 12A shows a scheme using two up/down counters. In this case, the reference signal $V_{ref1}$ is chosen to be lower than the lowest possible reset level $V_{reset}$. This is just an example. At time t1 the ramp signal starts the first phase of its cycle and counter2 is enabled in a downwards counting direction. At time t2 the ramp signal crosses pixel signal $V_{reset}$ and counter2 is stopped. Counter1 is also enabled to begin counting in a downwards counting direction. At time t3 reference signal level $V_{ref1}$ is crossed and counter1 is stopped. At time t4 the ramp signal ends the first phase of its cycle. At time t5 the ramp signal begins the second phase of its cycle and counter2 is enabled to begin counting in the upwards direction. At time t6 the ramp signal crosses the pixel signal $V_{sig}$ and counter2 is stopped. Counter1 is enabled to begin counting in the upwards direction. At time t7 the ramp signal crosses reference signal level $V_{ref2}$ and counter1 is stopped. At time t8 the ramp signal ends the second phase of its cycle, and one complete cycle.

FIG. 12B shows another scheme which uses a two phase conversion cycle and two counters which count in a single direction. At time t1 the ramp signal starts the first phase of its cycle. At time t2 the ramp signal crosses reference signal level $V_{ref1}$ and counter1 is enabled. At time t3 the ramp signal crosses the pixel signal $V_{reset}$ and counter1 is stopped. Counter2 is enabled. At time t4 the ramp signal ends the first phase of its cycle and counter2 is stopped. At time t5 the ramp signal begins the second phase of its cycle and counter2 is enabled to resume counting. At time t6 the ramp signal crosses the pixel signal $V_{sig}$ and counter2 is stopped. Counter1 is enabled to resume counting. At time t7 the ramp signal crosses reference signal level $V_{ref2}$ and counter1 is stopped. At time t8 the ramp signal ends the second phase of its cycle, and one complete cycle.

In each case it is advantageous that the reference levels are chosen such that the final signal calculation remains simple.

In the schemes shown in FIGS. 11, 12A and 12B only one counter is operable at any time. An alternative form of apparatus to implement these schemes is to have just a single counter device which is used on a time-shared basis to: (i) accumulate a count of clock cycles for calibration purposes; (ii) accumulate a count of clock cycles for normal measurement purposes. After each counting period (e.g. the times t1-t2 in FIG. 11) the value accumulated by the counter is transferred to a register and the counter is reset to begin the next counting period (times t2-t3). In the example of FIG. 11 there is a second counting period (times t3-t4) during which counting is resumed from the value accumulated at time t2. This can be achieved by either: (i) transferring the value from the register back to the counter, and resuming counting from that value at time t3, or (ii) starting counting at time t3 from zero, and adding the value in the register with the value accumulated by the counter at time t4. In this option, the two counters 151, 152 shown in FIGS. 7A and 7B are implemented by a single counter device on a time-shared basis.

Reduced Number of Clock Cycles (Sparse Coded ADC)

Figure 13:
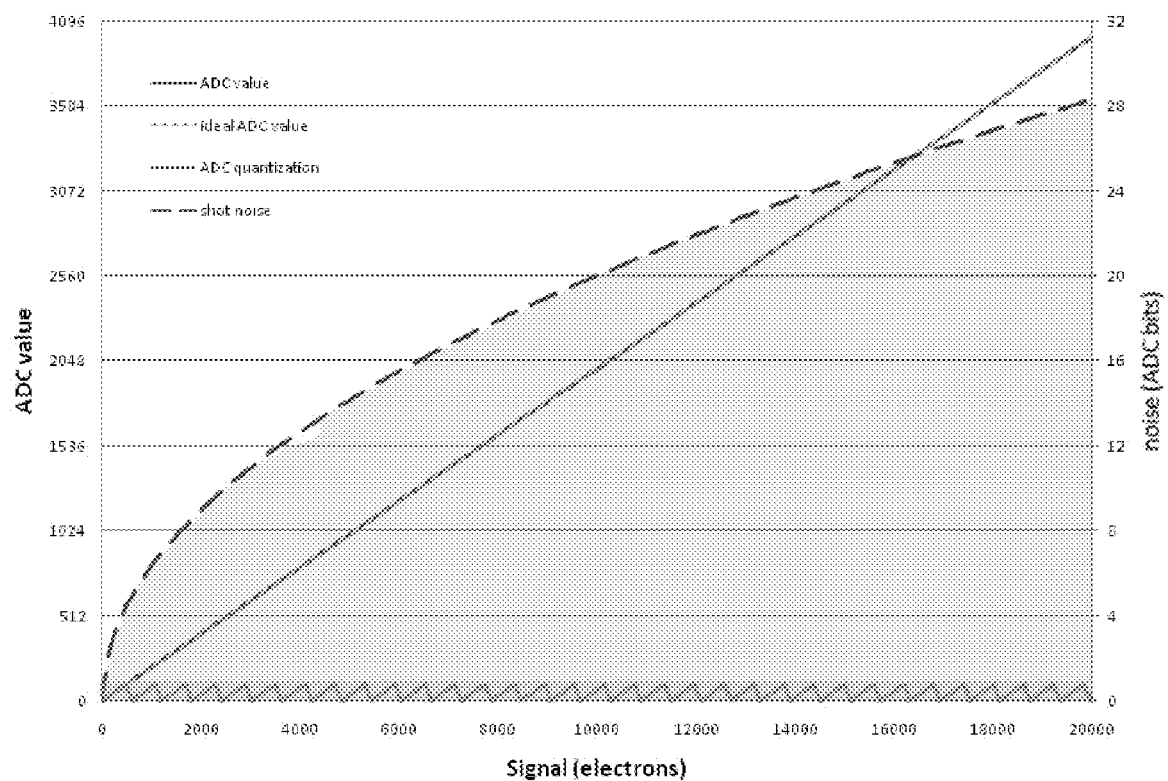
FIG. 13 shows noise affecting A-to-D conversion.

In the case of A-to-D conversion in an image sensor, the noise of the input signal increases with light induced signal. Dark signals have the lowest noise, the bright signals have more noise and are typically dominated by shot noise. FIG. 13 is a graph showing most important noise sources (quantization noise and shot noise) for different signal values (dark=0 electrons, light=20K electrons). For 12 bit conversion it is assumed that the full reference signal (4096 clock cycles) corresponds exactly with the full well charge signal (FWC=20480 electrons). As can be seen, the ADC quantization noise is much smaller than the shot noise in the input signal for larger (bright) signals.

Figure 14:
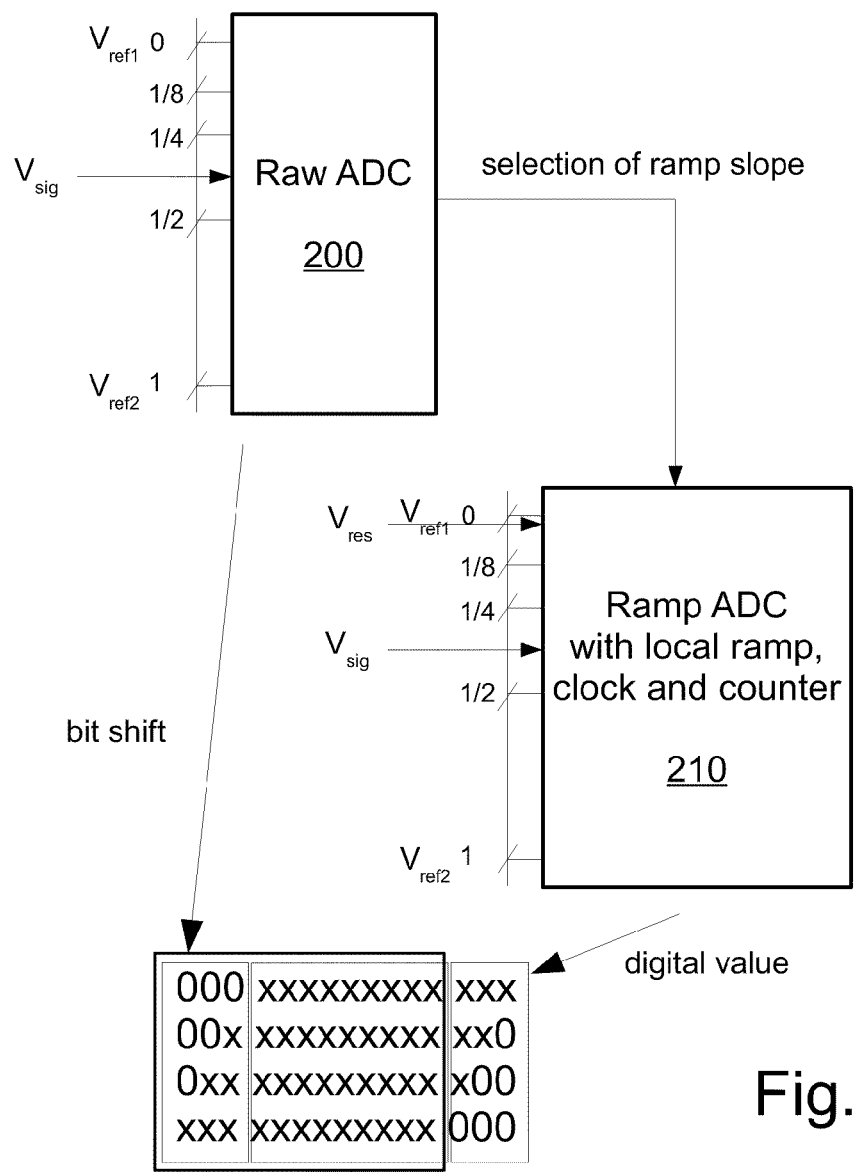
FIG. 14 shows a two-stage conversion scheme.

FIG. 14 schematically shows a converter which reduces the number of clock cycles for the conversion by allowing larger quantization noise for brighter signals. In this example conversion is performed in two stages. In a first stage, a raw A-to-D conversion is performed to determine in which range the signal is located. No attempt is made to precisely determine the signal value at this point. In FIG. 14 the possible range of values that an input can take is divided into four ranges $[0, \frac{1}{8}] \times (V_{ref1}-V_{ref2})$, $[\frac{1}{8}, \frac{1}{4}] \times (V_{ref1}-V_{ref2})$, $[\frac{1}{4}, \frac{1}{2}] \times (V_{ref1}-V_{ref2})$ or $[\frac{1}{2}, 1] \times (V_{ref1}-V_{ref2})$). In the second stage, A-to-D conversion is performed using a ramp slope and reference values matched to the range in which the signal falls (as determined during the first cycle). In the example of FIG. 14 the input signal $V_{sig}$ lies in the range $[\frac{1}{4}, \frac{1}{2}] \times (V_{ref1}-V_{ref2})$ and therefore the 3rd slope is selected with $V_{ref1}$ and ($V_{ref1}+V_{ref2}$)/2 as reference values. there is no need for the ramp signal to span the full range of possible signal values. The ramp signal only needs to span the range of possible signal values in the selected range. The final value is obtained by multiplying the value obtained from the second stage, by a factor based on the range that was used. Advantageously, the ranges are related by a factor of 2 to one another (1, 2, 4, 8) as this simplifies the calculation of the final value. The final value is scaled: by a factor of 1 for the range $[0, \frac{1}{8}] \times (V_{ref1}-V_{ref2})$; by a factor of 2 for the range $[\frac{1}{8}, \frac{1}{4}] \times (V_{ref1}-V_{ref2})$); by a factor of 4 for the range $[\frac{1}{4}, \frac{1}{2}] \times (V_{ref1}-V_{ref2})$) by a factor of 8 for the range $[\frac{1}{2}, 1] \times (V_{ref1}-V_{ref2})$. As these scale factors are multiples of 2, the value determined by the second stage ADC only needs to be shifted by a number of bits (0, 1, 2, 3 bit shifts). Conversion can be achieved in 512 clock cycles compared to 4096 clock cycles if the ramp signal were to span the full signal range. Advantageously, the ADC converter 210 is a converter as previously described.

The input signal shown in FIG. 14 is $V_{sig}$ and it is this signal which is compared against the four ranges. A more accurate determination of the range can be made by applying the difference between $V_{reset}$ and $V_{sig}$ to the first ADC converter 200. However, the variation on $V_{reset}$ is typically not that large and can be tolerated if there is enough overlap of the different ramp signals at the decision points. So ultimately, it is a design trade-off depending on factors including: the $V_{reset}$ variation, the ramp signal overlap, and the number of bits in the first ADC.

Figure 15:
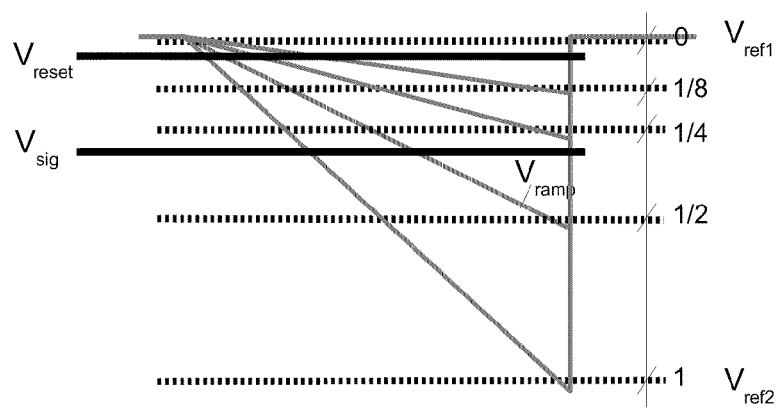
FIG. 15 shows a set of ramp signals used in the scheme of FIG. 14.

FIG. 15 shows the set of four ramp signals used in converter 210 of FIG. 14, with each ramp being associated with one of the four ranges shown for ADC 200. Advantageously, the slopes have a ratio of 1, 2, 4 and 8 to each other, as this matches the relationship of the three most significant bits of a binary number. However, it will be appreciated that other numbers of ranges (and corresponding slopes) can be used, and the ranges/slopes do not have to follow the ratio described here. The slopes do not need to be matched between columns, and the range/slope selected by the ADC of one column can be different to the range/slope selected by the ADC of another column. The "raw" conversion in ADC 200 does not need to be very accurate. ADC can be a flash ADC, in which a set of comparators compare the input signal against a ladder of different reference voltage levels. Other types of ADC can be used in ADC 200, such as ramp ADC, cyclic ADC etc.

Figure 16:
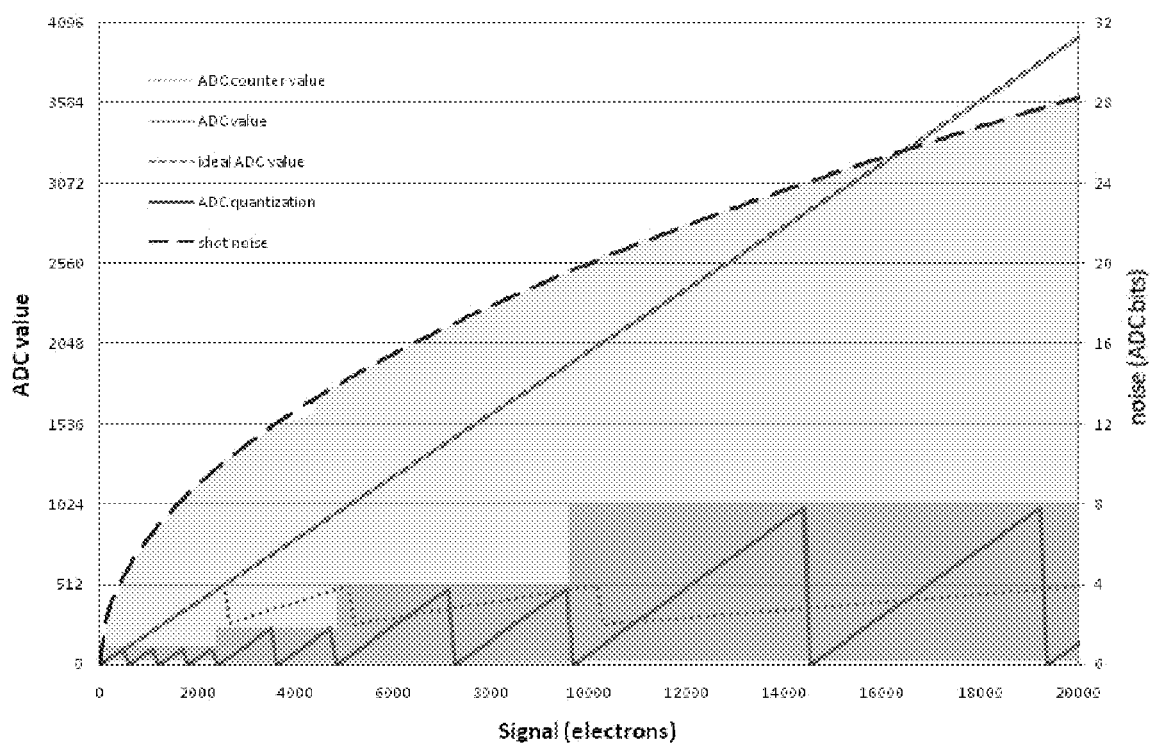
FIG. 16 shows noise resulting from A-to-D conversion using the scheme of FIG. 14.

FIG. 16 shows a similar graph to FIG. 13 for 12-bit conversion using the scheme shown in FIG. 14. The conversion is roughly 8 times as fast (9 bits conversion time). In this example, we assume that the full reference signal (4096 clock cycles) corresponds exactly with the full well charge signal (FWC=20480 electrons). As can be seen, the ADC quantization noise is now larger but still smaller than the shot noise in the input signal for larger (bright) signals.

Figure 17:
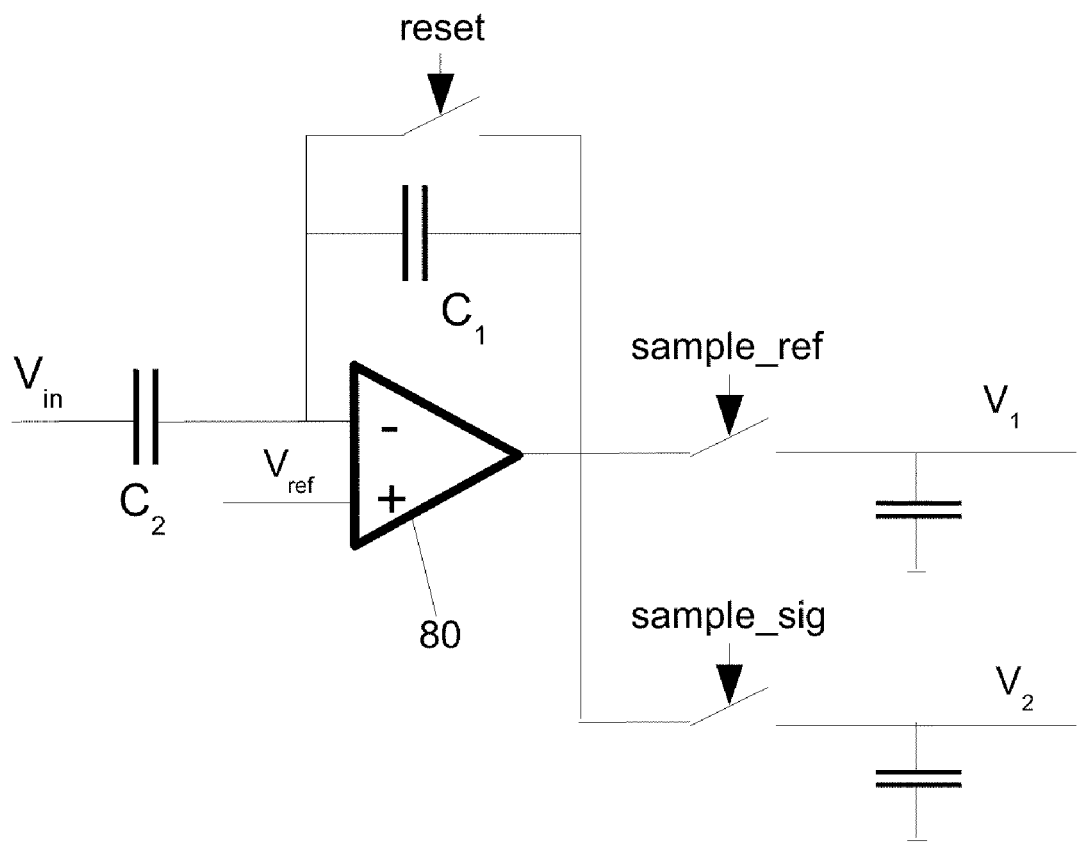
FIG. 17 shows an input circuit for any one of the embodiments of the conversion apparatus.

In each of the aspects of the invention described above the converter receives two analog input signals and outputs a digital value which is the difference between those input signals. The input signals have been described as the pixel signals $V_{reset}$, $V_{sig}$ but there are other possibilities for the input signals. In one alternative, one of the analog input signals is the quantity ($V_{reset}$−$V_{sig}$), a scaled version of this quantity, or this quantity with an offset, and the second of the analog input signals is a reference signal. This can be useful for various reasons, such as to change the offset level of the input signals to match the ADC input range or to add gain on the signal, which can be useful for noise performance. For the avoidance of doubt, the signal $V_{ref}$ shown in FIG. 17 is different to the reference signals $V_{ref1}$, $V_{ref2}$ used for calibration of the converter. FIG. 17 shows an input circuit which can be used with a converter of any one of the previously described embodiments. $V_{reset}$ and $V_{sig}$ are sequentially applied as the input signal $V_{in}$ of differential amplifier 80. When $V_{reset}$ is applied as the signal $V_{in}$, the reset switch in the feedback loop is closed. At the output of the amplifier 80, the signal value is equal to $V_{ref}$+$V_{offset}$ of the amplifier. This value is sampled by a switch on a first sample capacitor after the reset switch is released and forms signal $V_1$. This also samples the kTC noise of the capacitive amplifier. Then, the pixel (light-induced) signal $V_{sig}$ is applied to the input. The output signal level of the amplifier will then become approximately $V_{ref}$+$V_{offset}$+C2/C1*($V_{reset}$−$V_{sig}$), if kTC noise contribution is neglected. This is sampled on the other capacitor, and becomes analog signal $V_2$. The two signals on the capacitors are then used as the two signal inputs to the ADC. Typically, the non-uniformity of $V_{offset}$ between columns is made much smaller than $V_{reset}$ non-uniformity between pixels, so this circuit also performs a first analog FPN (fixed pattern noise) correction and this can also reduce the ramp swing for the reference conversion.

In another aspect of the invention the analog-to-digital converter is a stand-alone converter which does not form part of a set of converters. The converter has the form as shown in FIG. 7A, with a local clock 110, a local reference signal generator 140 which outputs a pair of DC reference levels $V_{ref1}$, $V_{ref2}$ and a local ramp generator 120 which outputs a ramp signal. The reference signals are compared with the ramp signal, and thereby define a time period between the times when the ramp signal crosses the reference signal levels, which can be measured by a first counter. A difference between times at which the ramp signal crosses the test signals is measured by the second counter. The count accumulated by the first counter can be used to calibrate the accuracy of the converter, and correct the count accumulated by the second counter.

The invention is not limited to the embodiments described herein, which may be modified or varied without departing from the scope of the invention.

The invention claimed is:

1. An analog-to-digital converter for generating an output digital value equivalent to the difference between two analog signals, the converter forming part of a set of converters, the converter comprising:
    at least one input for receiving a first analog signal and a second analog signal;
    an input for receiving a ramp signal;
    a clock which is arranged to generate a clock signal, wherein the clock is dedicated to the converter, or a sub-set of converters in the set of converters;
    a first counter which is operable to accumulate a count of clock cycles when enabled;
    a control stage which is arranged to enable the first counter based on a comparison of the ramp signal with the first analog signal and the second analog signal.

2. A converter according to claim 1 further comprising:
    an input for receiving at least one reference signal which is common to the set of converters;
    a second counter which is operable to accumulate a count of clock cycles when enabled;
and wherein the control stage is further arranged to enable the second counter based on the at least one reference signal.

3. A converter according to claim 2 wherein the input for receiving at least one reference signal is arranged to receive a first reference signal and a second reference signal which are common to the set of converters;
    and wherein the control stage is arranged to enable the second counter based on a comparison of the ramp signal with at least the first reference signal and the second reference signal.

4. A converter according to claim 3 wherein the first reference signal and the second reference signal are DC signals.

5. A converter according to claim 2 wherein the at least one reference signal comprises an enable signal for the first counter, the enable signal being common to the set of converters.

6. A converter according to claim 2 further comprising logic which is arranged to use the value accumulated by the second counter to calibrate the value accumulated by the first counter.

7. A converter according to claim 6, wherein the logic is arranged to calculate a ratio of the value accumulated by the first counter and the value accumulated by the second counter.

8. A converter according to claim 2, wherein the control stage is arranged to enable the first counter and the second counter during different portions of a cycle of the ramp signal.

9. A converter according to claim 8, wherein the different portions are contiguous portions of a cycle of the ramp signal.

10. A converter according to claim 8 further comprising logic which is arranged to calculate a ratio of the value accumulated by the first counter and the sum of the values accumulated by the first and second counters.

11. A converter according to claim 2 wherein the control stage is arranged to enable the second counter on a less frequent basis than the control stage is arranged to enable the first counter.

12. A converter according to claim 2 comprising a single counter device which is arranged to be used on a time-shared basis as the first counter and the second counter.

13. A converter according to claim 1, further comprising a ramp generator for generating the ramp signal, wherein the ramp generator is dedicated to the converter, or a sub-set of converters in the set of converters.

14. A converter according to claim 1 in the form of a processing stage for processing an output of at least one of a pixel, and a group of pixels, of a pixel array, wherein the analog signals are a reset level of a pixel and a signal value of the pixel following exposure to radiation.

15. A converter according to claim 1 in the form of a processing stage for processing an output of at least one of a pixel, and a group of pixels, of a pixel array, wherein the analog signals are a difference between a reset level of a pixel and a signal value of the pixel following exposure to radiation and a reference signal.

16. A pixel array comprising an array of pixels and wherein an analog-to-digital converter according to claim 1 is associated with a pixel of the array, or a group of pixels of the array.

17. Analog-to-digital conversion apparatus comprising a set of analog-to-digital converters arranged in parallel, each analog-to-digital converter comprising:
- at least one input for receiving a first analog signal and a second analog signal;
- an input for receiving a ramp signal;
- a clock which is arranged to generate a clock signal, wherein the clock is dedicated to the converter, or a sub-set of converters in the set of converters;
- a first counter which is operable to accumulate a count of clock cycles when enabled;
- a control stage which is arranged to enable the first counter based on a comparison of the ramp signal with the first analog signal and the second analog signal.

* * * * *